US006628392B2

(12) United States Patent
Kuroda et al.

(10) Patent No.: US 6,628,392 B2
(45) Date of Patent: Sep. 30, 2003

(54) LIGHT MODULATION APPARATUS AND OPTICAL SWITCH, MOVEMENT DETECTING DEVICE AND DISTANCE MEASURING DEVICE, ALIGNMENT DEVICE AND SEMICONDUCTOR ALIGNER, AND PROCESSES THEREOF

(75) Inventors: Ryo Kuroda, Kanagawa (JP); Yasuhiro Shimada, Kanagawa (JP); Junichi Seki, Kanagawa (JP); Takako Yamaguchi, Kanagawa (JP); Yasuhisa Inao, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 173 days.

(21) Appl. No.: 09/931,720

(22) Filed: Aug. 20, 2001

(65) Prior Publication Data

US 2003/0128361 A1 Jul. 10, 2003

(30) Foreign Application Priority Data

Aug. 22, 2000 (JP) ........................................ 2000-251598

(51) Int. Cl.[7] .............................................. G01B 11/00

(52) U.S. Cl. ...................... 356/400; 250/492.2; 355/53; 359/237; 385/16; 385/140; 430/5

(58) Field of Search ................................. 356/153, 399, 356/400, 401; 385/16, 19, 37, 52, 140, 15; 355/53; 250/491.1, 492.2; 430/5, 30; 359/128, 130, 237

(56) References Cited

U.S. PATENT DOCUMENTS

| 4,848,911 A | * | 7/1989 | Uchida et al. ............... 356/509 |
| 5,418,771 A | | 5/1995 | Kasanuki et al. ........... 369/126 |
| 5,508,527 A | | 4/1996 | Kuroda et al. ............ 250/491.1 |
| 5,973,316 A | | 10/1999 | Ebbesen et al. ............. 250/216 |
| 6,171,730 B1 | * | 1/2001 | Kuroda et al. .................. 430/5 |
| 2001/0042838 A1 | * | 11/2001 | Saito et al. ................. 25/491.1 |

FOREIGN PATENT DOCUMENTS

| EP | 0 329 433 A2 | * | 8/1989 |
| JP | 11-7207 | * | 3/1999 |

* cited by examiner

*Primary Examiner*—Alan A. Mathews
(74) *Attorney, Agent, or Firm*—Fitzpatrick, Cella, Harper & Scinto

(57) ABSTRACT

Disclosed herein is a light modulating apparatus comprising first and second two periodic structures each having a period smaller than the wavelength of light emitted from a light source, and a moving means for relatively moving the two periodic structures, wherein the surface of the first periodic structure is brought near to the surface of the second periodic structure to a space not longer than the wavelength to arrange them in a state opposed to each other, the light incident on the first periodic structure is converted into near-field light by the first periodic structure, the converted near-field light is transmitted through the second periodic structure and converted into propagation light by scattering the near-field light on the back surface of the second periodic structure, and the intensity of the propagation light is modulated by relatively moving the two periodic structures by the moving means.

35 Claims, 17 Drawing Sheets

RELATIVE DISPLACEMENT ON
x-y TWO-DIMENSIONAL PLANE

RELATIVE DISPLACEMENT IN z DIRECTION

US 6,628,392 B2

LIGHT MODULATION APPARATUS AND OPTICAL SWITCH, MOVEMENT DETECTING DEVICE AND DISTANCE MEASURING DEVICE, ALIGNMENT DEVICE AND SEMICONDUCTOR ALIGNER, AND PROCESSES THEREOF

BACKGROUND OF THE INVENTION

1. Field of the Invention

The present invention relates to an optical switch used in optical communication and image forming apparatus for cameras, displays and the like, an encoder for distance measurement of nanometric accuracy, and a light modulating apparatus, a movement detecting device and an alignment device used in gap control, alignment and the like between a mask and a wafer in a semiconductor aligner, and the like.

2. Related Background Art

The integration degree of semiconductor devices such as LSI goes on high density, and an aligner using an excimer laser or an X-ray stepper have been utilized at present. As aligners of the next generation for foaming minuter patterns, apparatus using an F2 laser beam, electron beam, EUV radiation or near-field radiation have been investigated. In such aligners, line width resolution of 0.1 $\mu$m or shorter is going to be made. However, the relative alignment accuracy between a mask and a wafer required therefor is required to be one tenth thereof, i.e. 10 nm or less at the minimum. As an alignment method of such high accuracy, a double diffraction grating method has heretofore been proposed [Flanders et al., Appl. Phys. Lett., Vol. 31, p. 426 (1977)].

The principle of this method is shown in FIG. 20. In this method, a diffraction grating is provided on each of a mask 2001 and a wafer 2002, and a laser beam 2003 is incident on these diffraction gratings to detect the diffracted ray intensity of a plurality of diffracted rays from each of the diffraction gratings, thereby detecting relative misregistration between the mask and the wafer to conduct relative alignment. Incidentally, in FIG. 20, reference numerals and characters 2004, 2005, 2006, 2007, 2008, 2009, P, d and Z indicate a grating, a mark, a detector 1, a detector 2, a device for totalizing I, an alignment signal, a pitch, a displacement and a gap, respectively.

On the other hand, there has been proposed an apparatus in which light transmission is enhanced in the case where an array of apertures provided on a metal thin film are arranged at a selected period as to the wavelength of incident light (Japanese Patent Application Laid-Open No. 11-072607). In this proposal, it is described that when the size of each aperture is from 150 nm to 1 $\mu$m, and a pitch between the apertures is from 0.6 to 1.8 $\mu$m, in an array of aperture of a specific pitch corresponding to the wavelength (0.5 to 1.0 $\mu$m) of light incident on a portion at which the apertures are arranged, light more than the quantity of light incident on an aperture portion is transmitted through the array of apertures. It is described herein that the intensity of the light transmitted has a peak according to the correlation between the period of the array of apertures and the wavelength and becomes strong when $\lambda/P$ ($\lambda$: the wavelength; P: the period of the array of apertures) is under certain conditions, and moreover the peak appears periodically when the wavelength of the incident light is continuously changed.

The double diffraction grating method is sensitive to a wavelength variation of a laser used in alignment, and a signal component by the wavelength variation of the laser overlaps a detected signal of the quantity of lateral misregistration. In addition, since it is necessary to use coherent light, a speckle noise by stray light overlaps, and so resolving power for the detection of the quantity of misregistration is lowered.

The phenomenon described in Japanese Patent Application Laid-Open No. 11-072607 is a phenomenon heretofore known as Wood's anomaly caused by the fact that a grating space of a diffraction grating gradually comes near to the wavelength, whereby reflected light deviates from an originally thinkable diffraction efficiency and concentrates on zero-order diffracted light [reference literature: "Hikari no Enpitsu (Optical Pencil)", Masao Tsuruta (1984); and "Electromagnetic Theory of Gratings", R. Petit (1980)]. More specifically, the phenomenon is a phenomenon caused at the time the relationship between the aperture period and the wavelength satisfies certain periodic conditions since the intensity of the light transmitted through the array of apertures changes periodically according to the wavelength of the light, and in a resonance region between the array of apertures and the incident light and has involved the following problems.

First, since it is the phenomenon in the resonance region described above, the size of each aperture is limited to about ½ to 2 times as large as the wavelength of light used, and the resolving power is also limited to this extent.

Second, since such resonance conditions must be satisfied, the production accuracy of the aperture size against the light wavelength becomes severe, and the production cost of the apertures becomes expensive.

Third, in this phenomenon, increase in transmitted light is a phenomenon in a far field observed by propagation light, and this method cannot be applied to a near-field region.

SUMMARY OF THE INVENTION

It is an object of the present invention to solve the above problems and provide a light modulating apparatus which can be applied to a near-field region, realize light modulation free of dependence on wavelength and permits realizing high-accuracy light modulation free of any noise cause by wavelength variations even when incoherent light little in noise cause or a laser beam is used, an optical switch using the apparatus, a movement detecting device, a distance measuring device and an alignment device using the detecting device, a semiconductor aligner using the alignment device, and processes thereof.

An example of the present invention for achieving the above object is as follows.

According to the present invention, there is provided a light modulating apparatus comprising:

first and second two periodic structures each having a period smaller than the wavelength of light emitted from a light source; and a moving means for relatively moving the two periodic structures, wherein the surface of the first periodic structure is brought near to the surface of the second periodic structure to a space not longer than the wavelength to arrange them in a state opposed to each other, the light incident on the first periodic structure is converted into near-field light by the first periodic structure, the converted near-field light is transmitted through the second periodic structure and converted into propagation light by scattering the near-field light on the back surface of the second periodic structure, and the intensity of the propagation light is modulated by relatively moving the two periodic structures by the moving means.

The object is achieved by a light modulating process, an optical switch, movement detecting process and device, distance measuring process and device, aligning process and device, and a semiconductor aligner using the above-described principle.

The details thereof will be described by the following embodiments and EXAMPLES.

In the figures, like reference characters indicate like parts or meanings.

DESCRIPTION OF THE PREFERRED EMBODIMENTS

The present inventors have found a novel phenomenon that apertures not longer than a wavelength are arranged in a region not longer than the wavelength, and the density arranged is changed, whereby the intensity of near-field light come out of the apertures can be controlled. The present invention has been made in the course of researches on utilization and application of this phenomenon.

This phenomenon will hereinafter be described with reference to FIGS. 4A and 4B.

Figure 4A:
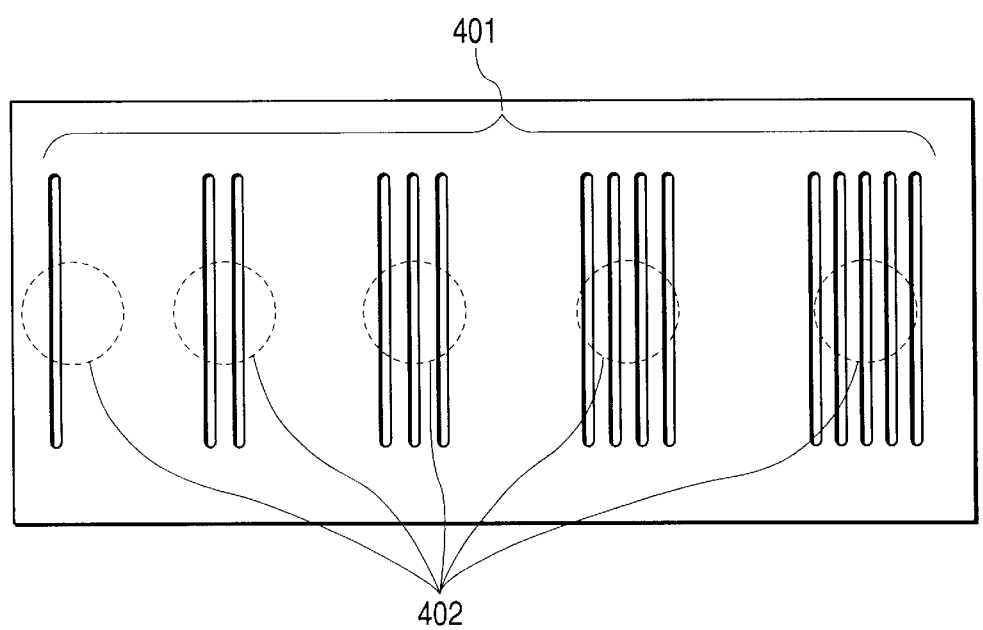
FIGS. 4A and 4B illustrate a novel phenomenon that the intensity of near-field light can be controlled.
Figure 4B:
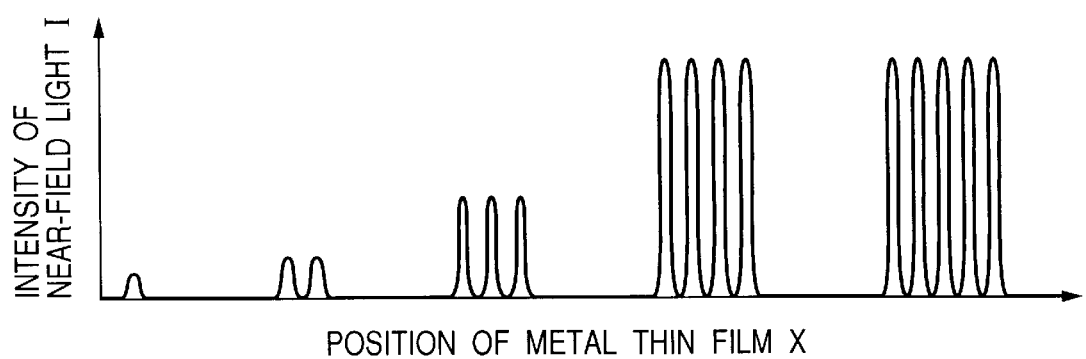

When light is exposed to a metal thin film having such minute apertures 401 not wider than the wavelength of the light as illustrated in FIG. 4A, near-field light is generated in the vicinity of the apertures. Here, the wavelength of the light is 530 nm, the width of each aperture is 80 nm, a pitch between adjacent apertures is 160 nm. When the intensity of the near-field light generated is measured by observation through a scanning near-field optical microscope (SNOM), the intensity was found to vary according to how to arrange apertures 401 not wider than the wavelength. The intensity of the near-field light is different between the case where only one aperture 401 not wider than the wavelength is present in a region 402 that is about the size of the wavelength and the case where plural apertures are present therein.

The intensity of the near-field light becomes stronger as the density of apertures 401 present in region 402 that is about the size of the wavelength increases. On the contrary, the intensity of the near-field light becomes weaker as the density of apertures 401 present in region 402 that is about the size of the wavelength decreases. FIG. 4A illustrates the case where an aperture, 2 apertures, 3 apertures, 4 apertures and 5 apertures are respectively present in regions 402 that are about the size of the wavelength. When only one aperture 401 is present in region 402 that is about the size of the wavelength, the intensity of the near-field light is very weak as illustrated in FIG. 4B. However, the intensity of the near-field light come out of each aperture becomes stronger as the number of apertures increases to 2, 3 or 4 apertures. The intensity of the near-field light increases as the number of apertures increases. When apertures more in number than region 402 that is about the size of the wavelength can contain are arranged, however, the intensity of the near-field light increases no longer and becomes constant. As illustrated in FIG. 4B, it is found that the intensity of the near-field light does not change even when the number of apertures 401 present increases from 4 to 5. More specifically, it is found that the intensity of the near-field light increases according to the density of apertures present in the region that is about the size of the wavelength.

From the findings described above, it has been found that even when sufficient intensity of the near-field light is not achieved by only one minute aperture, the intensity of the near-field light transmitted through apertures can be increased by causing a plurality of apertures to exist in the region that is about the size of the wavelength. By the finding of this phenomenon, the application of the near-field light to light modulating devices, movement detecting devices and alignment devices, that the application has been considered to be difficult due to the conventional weak intensity of near-field light, namely, measurement control of nanometric order making use of the near-field light has become feasible.

The details of a light modulating device in the first embodiment of the present invention will hereinafter be described with reference to FIG. 1 to FIG. 3A through FIG. 3E.

Incident light 102 which is propagation light emitted from a light source 101 is incident on a periodic structure A 104 provided on the front surface (surface on the lower side in FIG. 1) of a transparent support substrate A 103 from the back surface (on the upper side in FIG. 1) of the periodic structure. Here, as transparent support substrate A 103, is selected a substrate made of a transparent material such as glass, which transmits incident light 102. As periodic structure A 104, is used that obtained by, for example, forming a metal thin film (film thickness: 20 to 100 nm) of Cr, Al or the like on transparent support substrate A 103 and forming slit-like apertures in the thin film using electron beam processing or focused ion beam processing, a processing apparatus utilizing a scanning probe microscope, or the like. Here, a space D between periodic structures is controlled to 10 to 100 nm which is at most a half of the wavelength of incident light 102, and an aperture pitch o is also controlled to 20 to 200 nm which is at most a half of the wavelength of incident light 102. The length (in a longitudinal direction) of the aperture may be selected to an optimum length according to use application. Incidentally, reference numerals 110 indicates a light detector, and reference character K designates a light intensity signal outputted.

Figure 2:
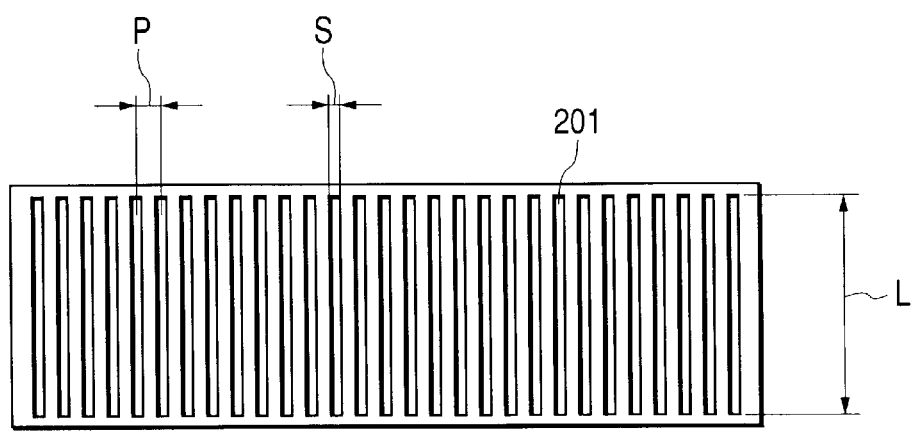
FIG. 2 illustrates an exemplary aperture pattern in the first embodiment of the present invention.
Figure 3A:
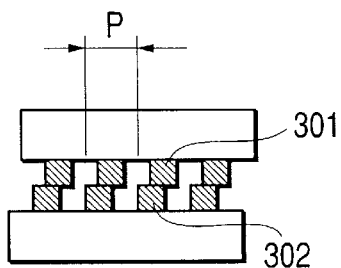
FIGS. 3A, 3B, 3C, 3D and 3E illustrate the state that the intensity of scattered light of near-field light in the first embodiment of the present invention periodically varies according to the relative displacement of periodic structures in an x direction.
Figure 3B:
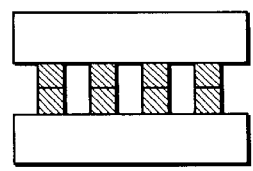
Figure 3C:
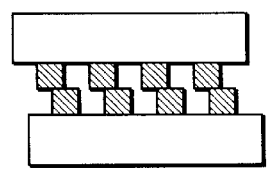
Figure 3D:
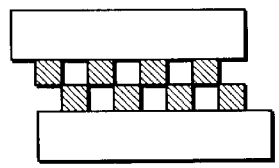
Figure 3E:
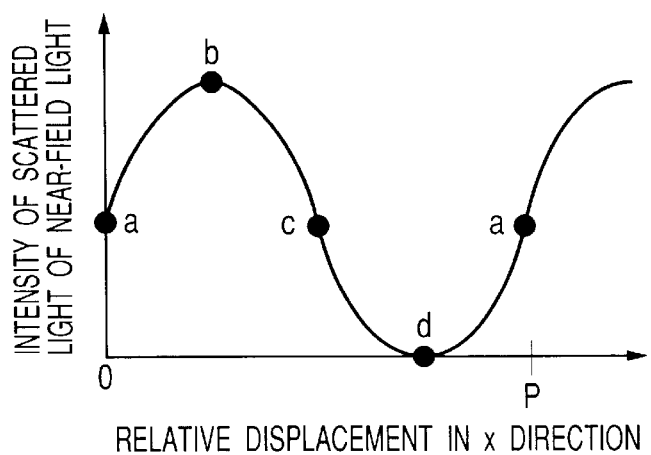

An exemplary aperture pattern formed is illustrated in FIG. 2. In FIG. 2, aperture slits 201 each having an aperture width S of 80 nm are periodically arranged at a pitch P of 160 nm. The length L of each aperture slit is 100 μm.

The light incident on periodic structure A 104 from the back surface thereof is transmitted through the apertures of periodic structure A 104 and converted from the propagation light into near-field light 105, and the near-field light comes out of the front surface (on the lower side in FIG. 1) of periodic structure A 104. The front surface (on the upper side in FIG. 1) of a periodic structure B 106 is brought near to the near-field light 105 to a distance of at most 100 nm. Periodic structure B 106 is provided on a transparent support substrate B 107, and the material, form, production process and the like thereof are the same as in periodic structure A 104. The near-field light 105 to which the front surface of periodic structure B 106 has been brought near is transmitted through the apertures of periodic structure B 106 and at the same time scattered on the back surface (on the lower side in FIG. 1) of periodic structure B 106 into scattered light 108 of the near-field light to be converted again into propagation light.

Figure 1:
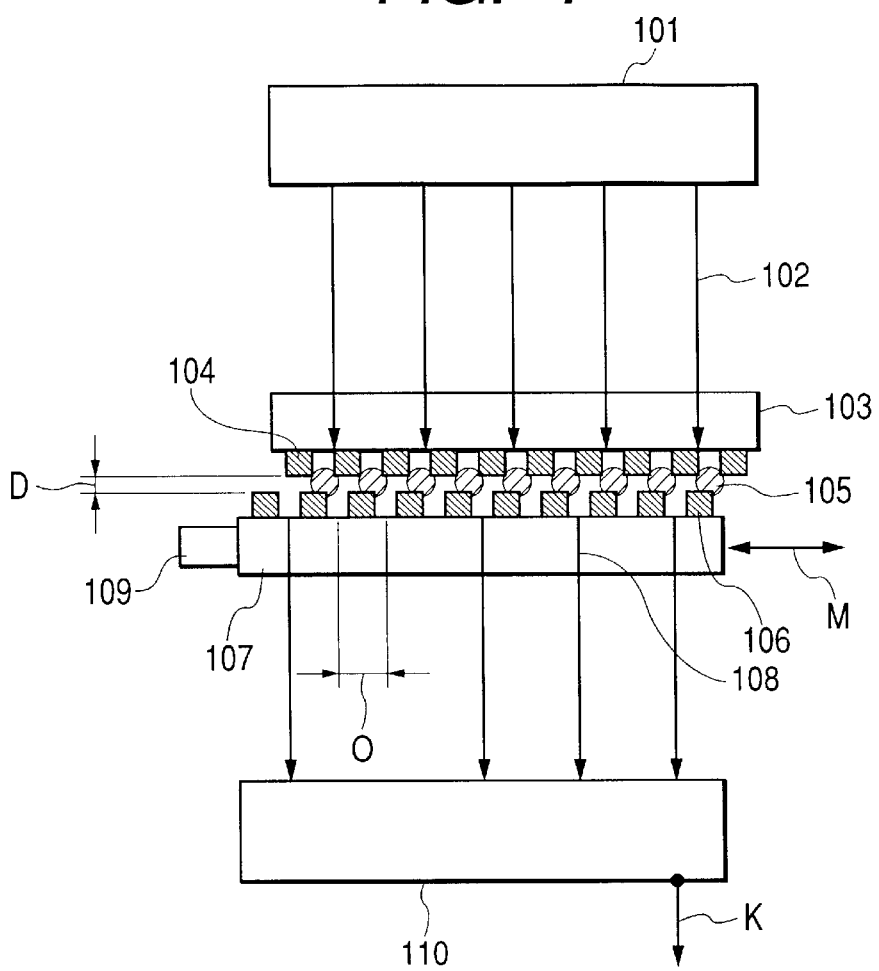
FIG. 1 illustrates in detail a light modulating apparatus according to the first embodiment of the present invention.

Here, periodic structure B 106 is moved in an x direction in FIG. 1 by an actuator 109. In FIG. 1, the direction of this relative movement is indicated by a double arrow M. When the intensity of scattered light 108 of the near-field light is measured by light detector 110 at this time, the intensity periodically varies according to the relative displacement in the x direction. The state of this variation is illustrated in FIGS. 3A to 3E. In FIGS. 3A to 3E, states of relative displacement which are different in the positional relationship between periodic structure A 301 and periodic structure B 302 from one another are shown in FIGS. 3A to 3D. Prots a, b, c and d represent the states shown by FIGS. 3A, 3B, 3C and 3D, respectively. As the relative displacement varies in order of a→b→c→a→ . . . , the intensity of the scattered light of the near-field light is changed to a medium value→ a maximum value→a medium value→a minimum value a medium value→ . . . . This is due to the fact that a proportion of the near-field light generated at the aperture portion of periodic structure A 301 transmitted through the aperture portion of periodic structure B 302 becomes maximum in the positional relationship of b in which the positions of the aperture portion of periodic structure A 301 and the aperture portion of periodic structure B 302 are just superimposed on each other, and a proportion of the near-field light generated at the aperture portion of periodic structure A 301 transmitted through the aperture portion of periodic structure B 302 becomes minimum in the positional relationship of d in which the positions of the aperture portion of periodic structure A 301 and the aperture portion of periodic structure B 302 are just inverted to deviate from each other. Accordingly, the period of this variation coincides with the pitch p of periodic structures A 301 and B 302.

The intensity of scattered light 108 of the near-field light can be changed between the maximum value and the minimum value by applying this principle and displacing the positional relationship between periodic structure A 301 and periodic structure B 302 by p/2 by means of actuator 109 (illustrated in FIG. 1) so as to change between b and d.

On the contrary, the positional relationship in the x direction between periodic structure A 301 and periodic structure B 302 can be detected from changes in intensity. A movement detecting device, which will be described in the following EXAMPLE 3, is produced by applying this principle.

The details of a light modulating device in the second embodiment of the present invention will hereinafter be described with reference to FIG. 5 to FIG. 7E.

Incident light 502 which is propagation light emitted from a light source 501 is incident on a periodic structure A 504 provided on the front surface (surface on the lower side in FIG. 5) of a transparent support substrate A 503 from the back surface (on the upper side in FIG. 5) of the periodic structure. Here, as transparent support substrate A 503, is selected a substrate made of a transparent material such as glass, which transmits incident light 502. As periodic structure A 504, is used that obtained by, for example, forming a metal thin film (film thickness: 20 to 100 nm) of Cr, Al or the like on transparent support substrate A 503 and forming slit-like apertures in the thin film using electron beam processing or focused ion beam processing, a processing apparatus utilizing a scanning probe microscope, or the like. Here, a space D between periodic structures is controlled to 10 to 100 nm, and an aperture pitch o is controlled to 20 to 200 nm. The length (in a longitudinal direction) of the aperture may be selected to an optimum length according to use application. Incidentally, reference numerals 510 indicates a light detector, and reference character K designates a light intensity signal outputted.

An exemplary aperture pattern formed is illustrated in FIG. 2. In FIG. 2, aperture slits 201 each having an aperture width S of 80 nm are periodically arranged at a pitch P of 160 nm. The length L of each aperture slit is 100 μm.

The light incident on periodic structure A 504 from the back surface thereof is transmitted through the apertures of periodic structure A 504 and converted from the propagation light into near-field light 505, and the near-field light comes out of the front surface (on the lower side in FIG. 5) of periodic structure A 504.

The front surface (on the upper side in FIG. 5) of a periodic structure B 506 is brought near to the near-field light 505 to a distance not longer than the wavelength of the light emitted from the light source in such a manner that the phases of the periodic structures are inverted, namely, the aperture portion of periodic structure A 501 and the aperture portion of periodic structure B 506 completely deviate from each other. Periodic structure B 506 is provided on a transparent support substrate B 507, and the material, form, production process and the like thereof are the same as in periodic structure A 504. The near-field light 505 to which the front surface of periodic structure B 506 has been brought near is transmitted through the apertures of periodic structure B 506 and at the same time scattered on the back surface (on the lower side in FIG. 5) of periodic structure B 506 into scattered light 508 of the near-field light to be converted again into propagation light.

Figure 6:
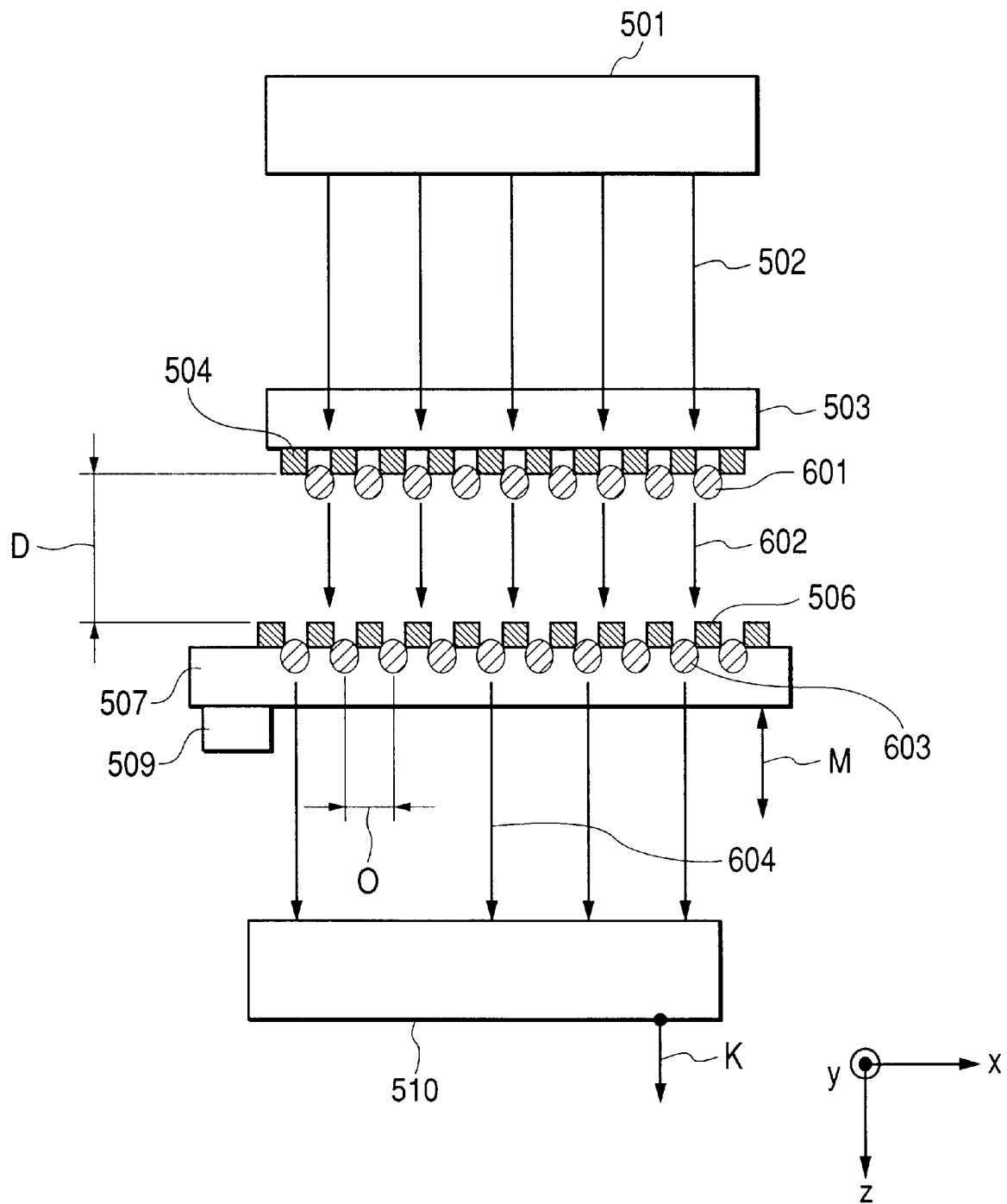
FIG. 6 illustrates the state that in the second embodiment of the present invention, the front surface of a periodic structure B is separated to a distance longer than the wavelength of light from the front surface of a periodic structure A.
Figure 7A:
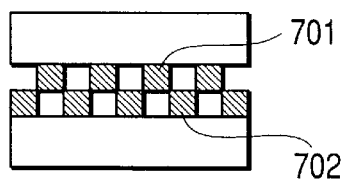
FIGS. 7A, 7B, 7C, 7D and 7E illustrate the state that the intensity of scattered light of near-field light in the second embodiment of the present invention varies according to the relative displacement of the periodic structures in a z direction.
Figure 7B:
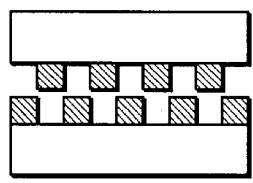
Figure 7C:
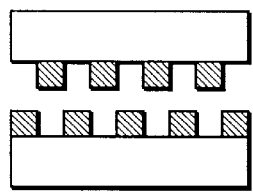
Figure 7D:
Figure 7D:
Figure 7E:
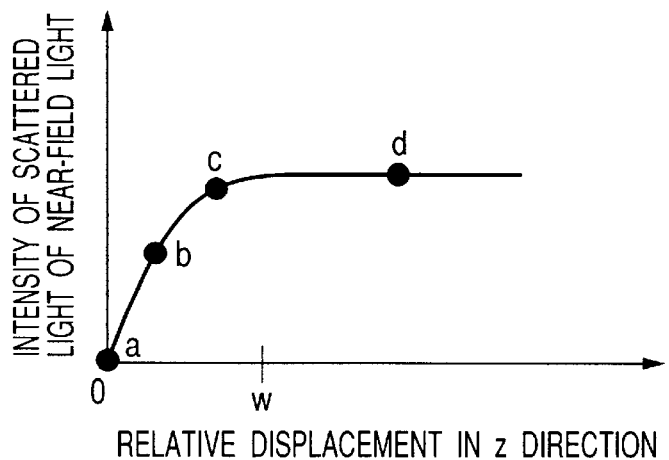

The state that the front surface of periodic structure B 506 is separated to a distance longer than the light wavelength from the front surface of periodic structure A 504 is illustrated in FIG. 6. Near-field light A 601 come out of the front surface (on the lower side in FIG. 6) of periodic structure A 504 is scattered on the front surface of periodic structure A 504 into scattered light 602 of near-field light A to be converted again into propagation light. Scattered light A 602 of near-field light A is incident on the front surface (on the upper side in FIG. 6) of periodic structure B 506, transmitted through the apertures of periodic structure B 506 and converted from the propagation light into near-field light B 603, and the near-field light comes out of the back surface (on the lower side in FIG. 6) of periodic structure B 506. The near-field light B 603 is scattered on the back surface of periodic structure B 506 into scattered light B 604 of the near-field light B to be converted again into propagation light.

Figure 5:
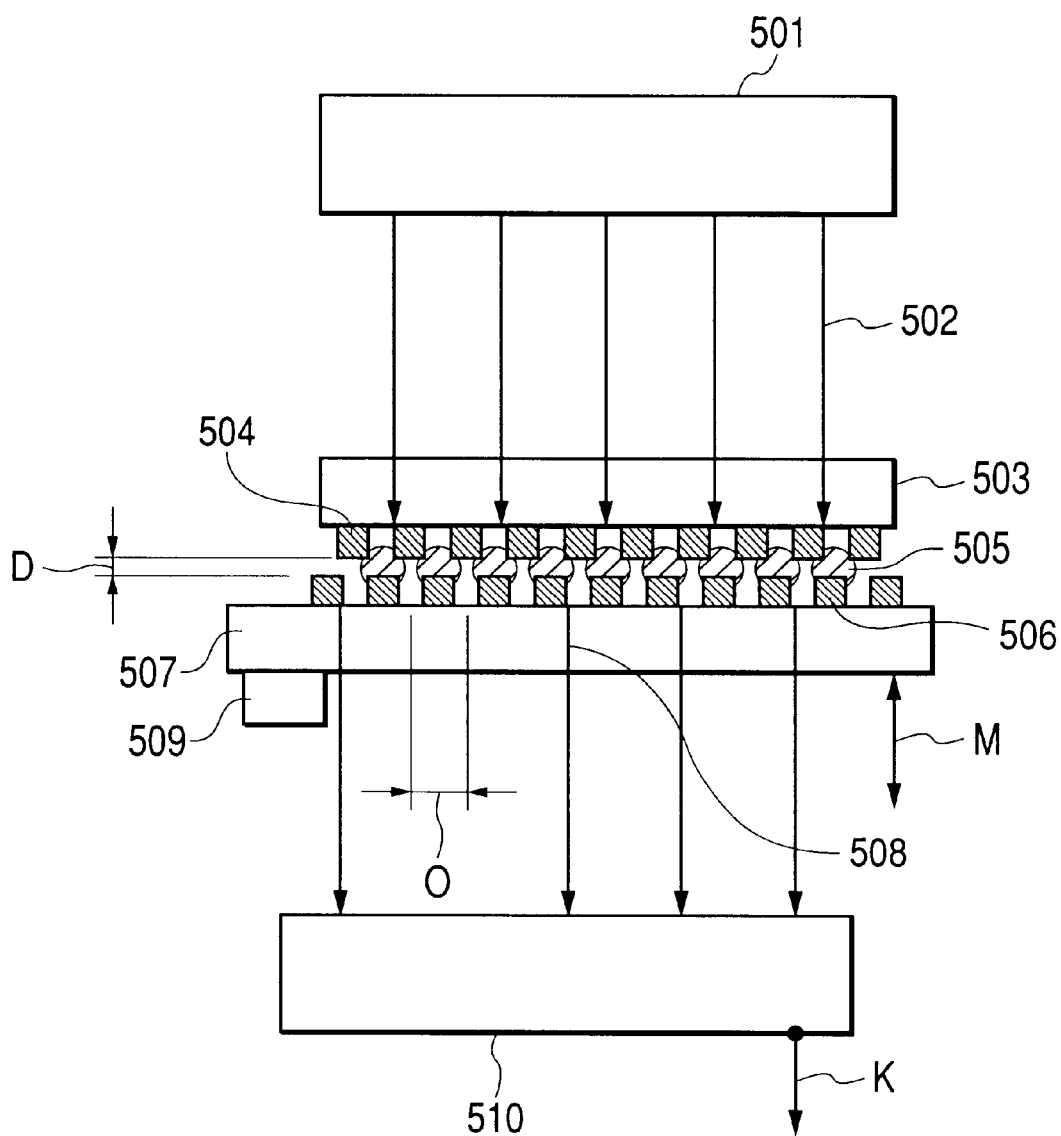
FIG. 5 illustrates in detail a light modulating apparatus according to the second embodiment of the present invention.

Here, periodic structure B 506 is moved in a z direction in FIGS. 5 and 6 by an actuator 509. When the intensity of scattered light 508 of the near-field light is measured by light detector 510 at this time, the intensity varies according to the relative displacement in the z direction. The state of this variation is illustrated in FIGS. 7A to 7E. In FIGS. 7A to 7E, states of relative displacement which are different in the positional relationship between periodic structure A 701 and periodic structure B 702 from one another are shown in FIGS. 7A to 7D. Prots a, b, c and d represent the states shown by FIGS. 7A, 7B, 7C and 7D, respectively. As the relative displacement varies in order of a→b→c→d→ . . . , the intensity of the scattered light of the near-field light is changed to a minimum value→a medium value→a maximum value→the fixed maximum value as it is. This is due to the fact that a proportion of the near-field light generated at the aperture portion of periodic structure A 701 transmitted through the aperture portion of periodic structure B 702 becomes minimum in the positional relationship of a in which the positions of the aperture portion of periodic structure A 701 and the aperture portion of periodic structure B 702 are just inverted to overlap each other, a proportion of the near-field light generated at the aperture portion of periodic structure A 701 transmitted through the aperture portion of periodic structure B 702 becomes higher as a space in the z direction between periodic structure A 701 and periodic structure B 702 is more distant from each other, and the proportion becomes constant when they are distant by a distance of about the wavelength or longer, the value of which wavelength is shown by w on the axis of abscissas of FIG. 7E.

The intensity of scattered light 508 and 604 of the near-field light can be changed between the minimum value and the maximum value by applying this principle and displacing the positional relationship between periodic structure A 701 and periodic structure B 702 by a distance of about the wavelength by means of actuator 509 (illustrated in FIGS. 5 and 6) so as to change between a and d.

On the contrary, the positional relationship in the z direction between periodic structure A 701 and periodic structure B 702 can be detected from this change in intensity. A movement detecting device, which will be described in the following EXAMPLE 4, is produced by applying this principle.

As described above, light modulation free of dependence on wavelength can be realized by using the principle that a structure that periodic structures each having an aperture width and a pitch of at most a half as short as the wavelength of light used are arranged in opposed relation to each other is irradiated with propagation light to convert the light into near-field light, the near-field light is transmitted through both periodic structures to convert it again into propagation light, and the intensity of the transmitted light is modulated by relatively moving both periodic structures. Therefore, a high-accuracy light modulating device, movement detecting device and alignment device which are free of any noise cause by wavelength variations even when incoherent light little in noise cause or a laser beam is used can be fabricated.

Since the quantity of the transmitted light is great, light modulation can be realized with high efficiency. Similarly, the great quantity of the transmitted light permits detecting a signal at a high S/N ratio to fabricate a high-accuracy movement detecting device and alignment device.

Specific examples of the present invention will hereinafter be described.

EXAMPLE 1

Figure 8:
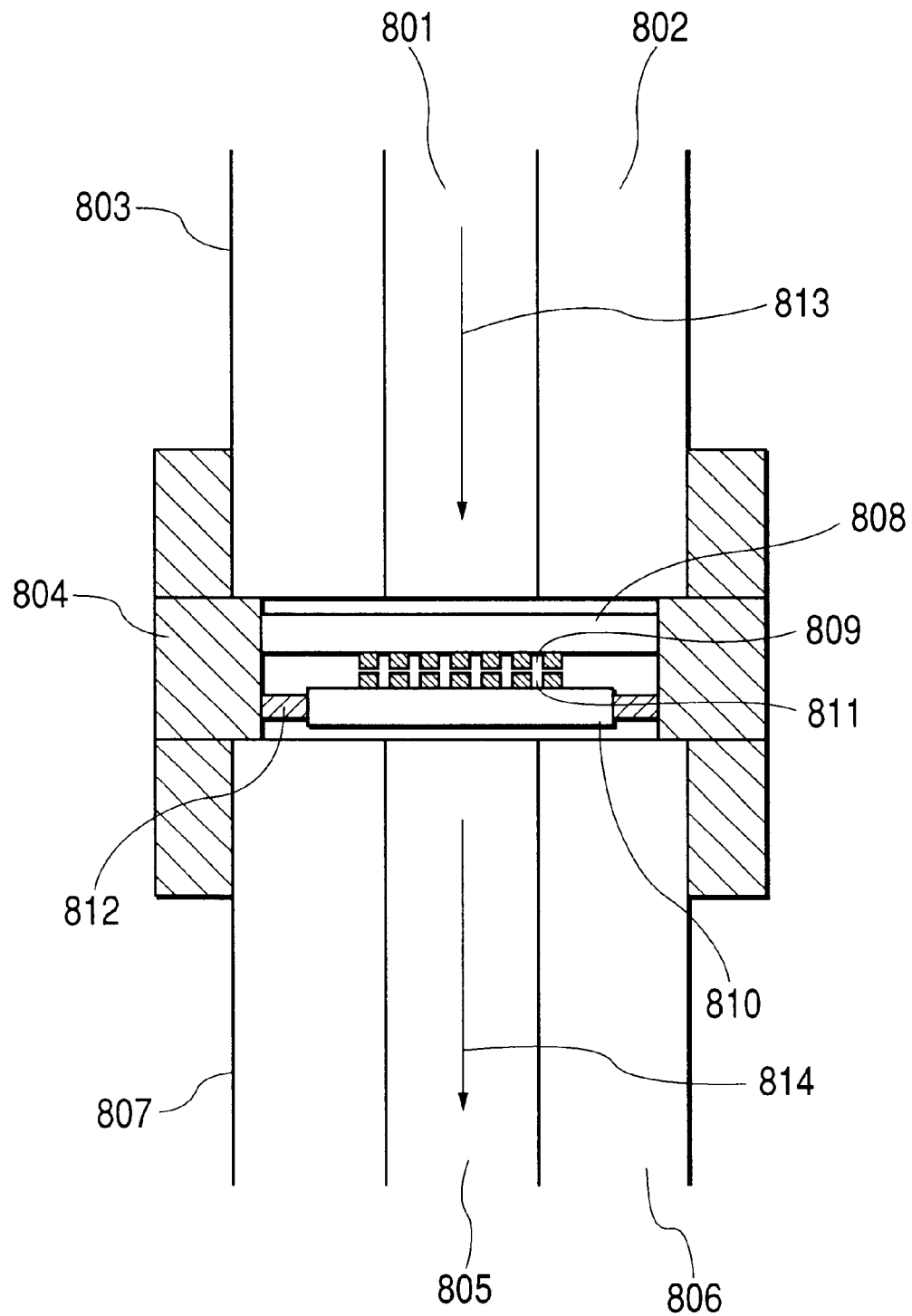
FIG. 8 illustrates an exemplary construction of an optical switch for optical fiber, to which the principle of light modulation in EXAMPLE 1 of the present invention is applied.

FIG. 8 illustrates an exemplary construction of an optical switch for optical fiber, to which the principle of light modulation in EXAMPLE 1 of the present invention is applied. In FIG. 8, optical fiber A 803 comprising a core A 801 and a clad A 802 is connected to optical fiber B 807 comprising a core B 805 and a clad B 806 by an optical adapter 804. In the interior of optical adapter 804, are arranged a periodic minute aperture slit A 809 provided on such a transparent support substrate A 808 as described above and a periodic minute aperture slit B 811 provided on a transparent support substrate B 810, so as to give a space of at most 100 nm.

A piezoelectric element 812 is installed on transparent support substrate B 810. By driving this element, periodic minute aperture slit B 811 is moved in a lateral direction in FIG. 8 relatively to periodic minute aperture slit A 809 to modulate the intensity of incident guided light 813 (wavelength: 1.3 μm) into exit guided light 814. In this device, the driving quantity and driving wave form of piezoelectric element 812 are selected, whereby this device can be operated as an optical switch for exit guided light 814 to incident guided light 813 or an intensity modulating device.

In this example, an example where the principle of light modulation according to the present invention is applied to the optical switch for optical fiber has been described. However, the concept of the present invention is not limited thereto, and it can also be applied to a shutter for camera and a switch•modulation for pixels in display.

EXAMPLE 2

Figure 9:
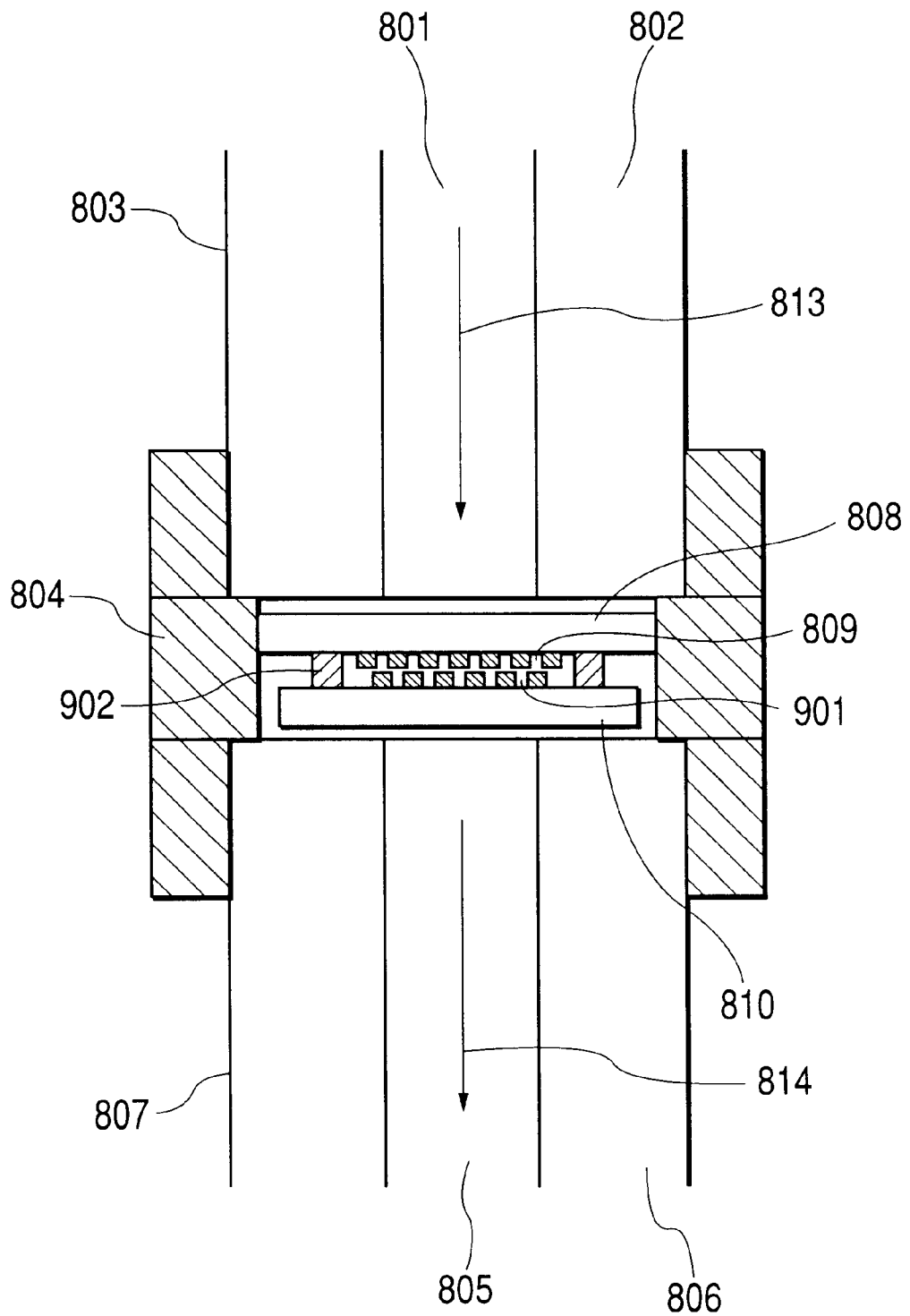
FIG. 9 illustrates an exemplary construction of an optical switch for optical fiber, to which the principle of light modulation in EXAMPLE 2 of the present invention is applied.

FIG. 9 illustrates an exemplary construction of an optical switch for optical fiber, to which the principle of light modulation in EXAMPLE 2 of the present invention is applied. In FIG. 9, optical fiber A 803 comprising a core A 801 and a clad A 802 is connected to optical fiber B 807 comprising a core B 805 and a clad B 806 by an optical adapter 804. In the interior of optical adapter 804, are arranged a periodic minute aperture slit A 809 provided on such a transparent support substrate A 808 as described above and a periodic minute aperture slit B 901 provided on a transparent support substrate B 810, so as to give a space of at most 100 nm. Here, periodic minute aperture slit A 809 and periodic minute aperture slit B 901 are arranged in such a manner that the phases of the periodic structures are inverted, namely, the aperture portion of periodic minute aperture slit A 809 and the aperture portion of periodic minute aperture slit B 901 completely deviate from each other in a lateral direction.

A piezoelectric element 902 is installed on transparent support substrate B 810. By driving this element, periodic minute aperture slit B 901 is moved in a vertical direction in FIG. 9 relatively to periodic minute aperture slit A 809 to modulate the intensity of incident guided light 813 (wavelength: 1.3 μm) into exit guided light 814. In this device, the driving quantity and driving wave form of piezoelectric element 902 are selected, whereby this device can be operated as an optical switch for exit guided light 814 to incident guided light 813 or an intensity modulating device.

In this example, an example where the principle of light modulation according to the present invention is applied to the optical switch for optical fiber has been described. However, the concept of the present invention is not limited thereto, and it can also be applied to a shutter for camera and a switch modulation for pixels in display.

EXAMPLE 3

Figure 10:
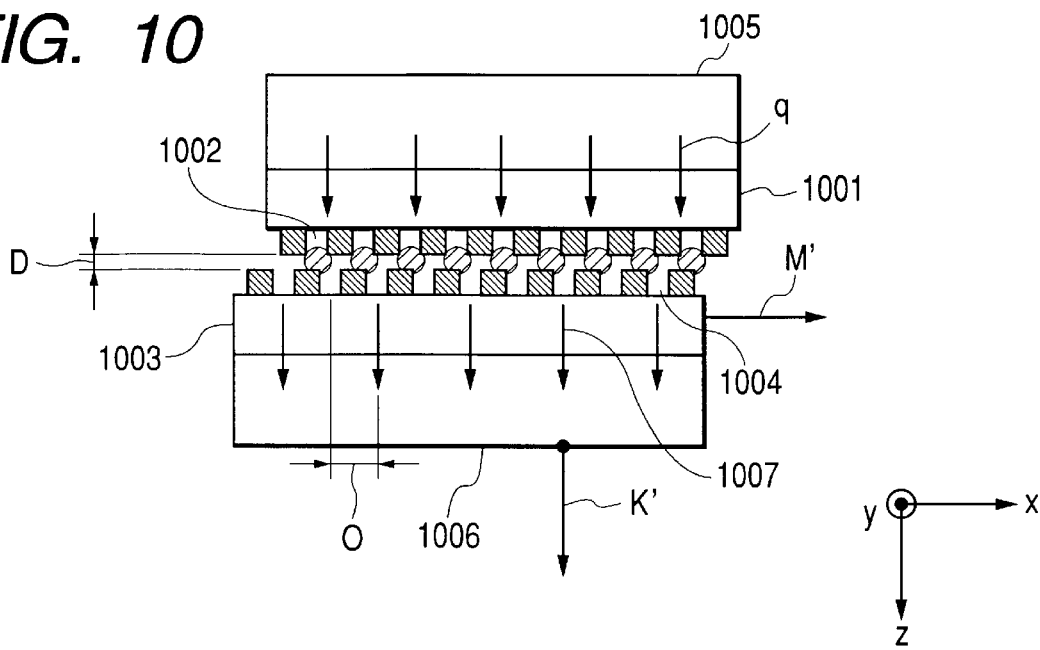
FIG. 10 illustrates an exemplary construction of a movement detecting device to which the principle of light modulation in EXAMPLE 3 of the present invention is applied.

FIG. 10 illustrates an exemplary construction of a movement detecting device to which the principle of light modulation in EXAMPLE 3 of the present invention is applied. In FIG. 10, a periodic minute aperture slit A 1002 provided on such a transparent support substrate A (front surface) 1001 as described above and a periodic minute aperture slit B 1004 provided on a transparent support substrate B (front surface) 1003 are arranged so as to give a space of at most 100 nm.

On the back surface (surface on the upper side in FIG. 10) of transparent support substrate A 1001, is installed LED (light-emitting diode) 1005 (central wavelength: about 670 nm) to apply light q from the back side of periodic minute aperture slit A 1002. PD (photodiode) 1006 is installed on the back surface of transparent support substrate B 1003 to detect the intensity of scattered light 1007 of near-field light scattered from on the back surface of periodic minute aperture slit B 1004.

When relative displacement as denoted by M' in FIG. 10 between periodic minute aperture slit A 1002 and periodic minute aperture slit B 1004 takes place in an x direction in FIG. 10, the intensity of scattered light 1007 of the near-field light periodically varies at the period of the periodic minute aperture slits according to the quantity of displacement as illustrated in FIG. 3 as the principle thereof has been described above. Therefore, the quantity of relative displacement can be detected from signals K' outputted from PD 1006.

Figure 11A:
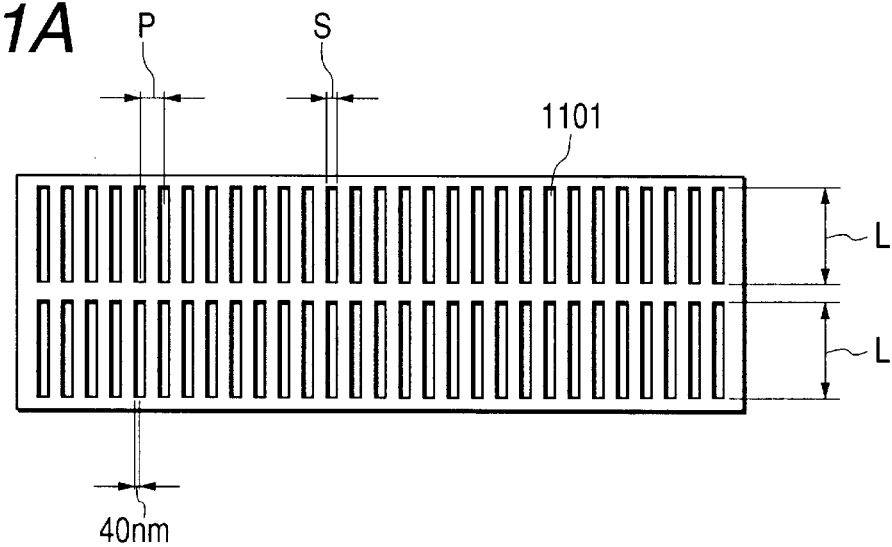
FIGS. 11A and 11B respectively illustrate exemplary aperture patterns of periodic minute aperture slits used in EXAMPLE 3 of the present invention.
Figure 11B:
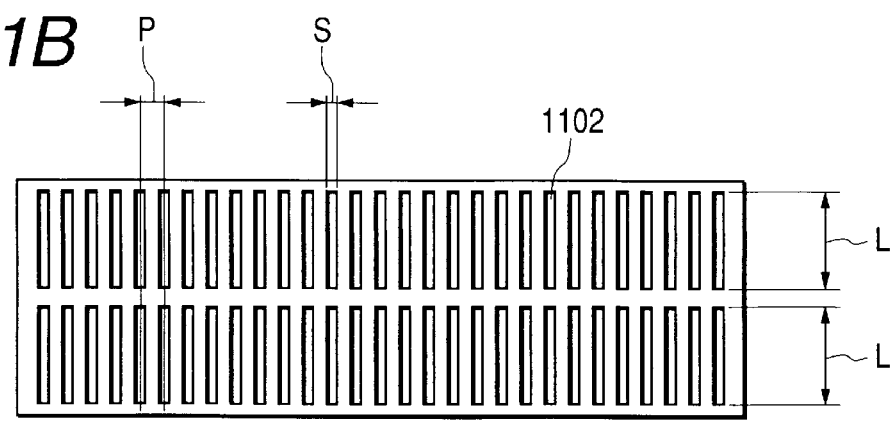

FIGS. 11A and 11B respectively illustrate exemplary aperture patterns of periodic minute aperture slit A 1002 and periodic minute aperture slit B 1004 used in this example. Periodic minute aperture slits A 1101 and B 1102 are each composed of 2 rows of aperture slits having an aperture width of 80 nm, the apertures of which are periodically arranged at a pitch of 160 nm. The length of each aperture slit is 100 μm. In this example, the phases of the aperture portions of the 2 rows of slits in periodic minute aperture slit A 1101 are caused to deviate by 90° (40 nm in FIGS. 11A and 11B). The phases of the aperture portions of the 2 rows of slits in periodic minute aperture slit B 1102 are equal to each other, and there is no deviation. The phases of periodic changes according to the quantities of relative displacement of relative displacement signals obtained by independently detecting scattered light of the near-field light transmitted through each of the 2 periodic minute aperture slits deviate by 90° from each other, and the direction of the relative displacement can be detected from the direction of this deviation.

EXAMPLE 4

Figure 12:
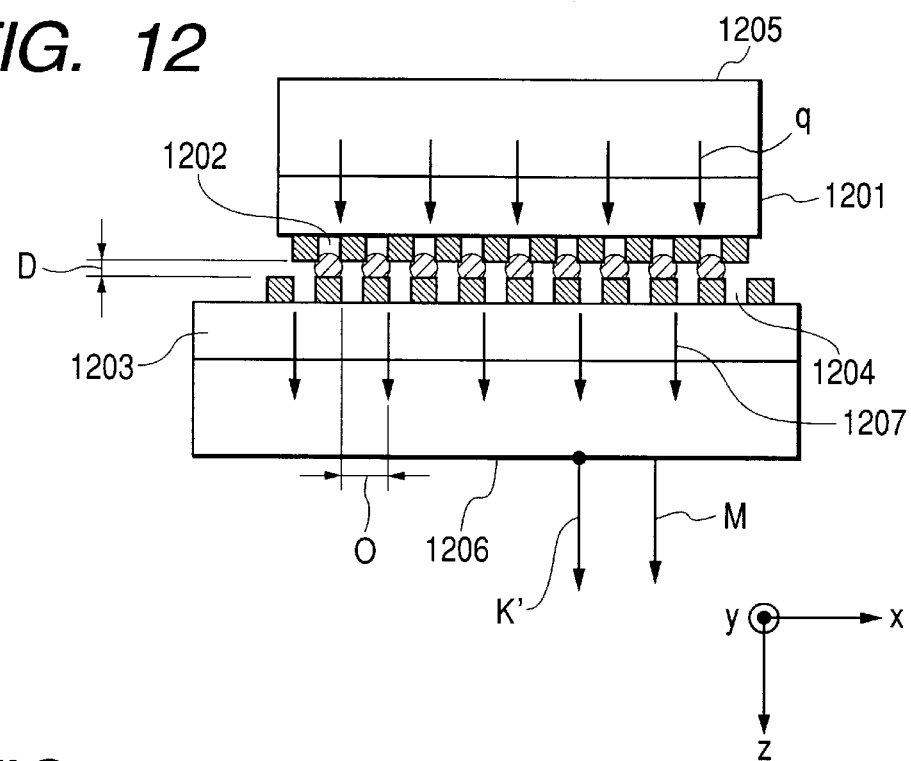
FIG. 12 illustrates an exemplary construction of a movement detecting device to which the principle of light modulation in EXAMPLE 4 of the present invention is applied.

FIG. 12 illustrates an exemplary construction of a movement detecting device to which the principle of light modulation in EXAMPLE 4 of the present invention is applied. In FIG. 12, a periodic minute aperture slit A 1202 provided on such a transparent support substrate A (front surface) 1201 as described above and a periodic minute aperture slit B 1204 provided on a transparent support substrate B (front surface) 1203 are arranged so as to give a space of at most 500 nm. Here, periodic minute aperture slit A 1202 and periodic minute aperture slit B 1204 are arranged in such a manner that the phases of the periodic structures are inverted, namely, the aperture portion of periodic minute aperture slit A 1202 and the aperture portion of periodic minute aperture slit B 1204 completely deviate from each other in a lateral direction.

On the back surface (surface on the upper side in FIG. 12) of transparent support substrate A 1201, is installed LED (light-emitting diode) 1205 (central wavelength: about 670 nm) to apply light q from the back side of periodic minute aperture slit A 1202. PD (photodiode) 1206 is installed on the back surface of transparent support substrate B 1203 to detect the intensity of scattered light 1207 of near-field light scattered from on the back surface of periodic minute aperture slit B 1204.

When relative displacement between periodic minute aperture slit A 1202 and periodic minute aperture slit B 1204 takes place in a z direction in FIG. 12, the intensity of scattered light 1207 of the near-field light periodically varies according to the quantity of displacement as illustrated in FIG. 7 as the principle thereof has been described above. Therefore, the quantity of relative displacement can be detected from signals outputted from PD 1206.

EXAMPLE 5

Figure 13:
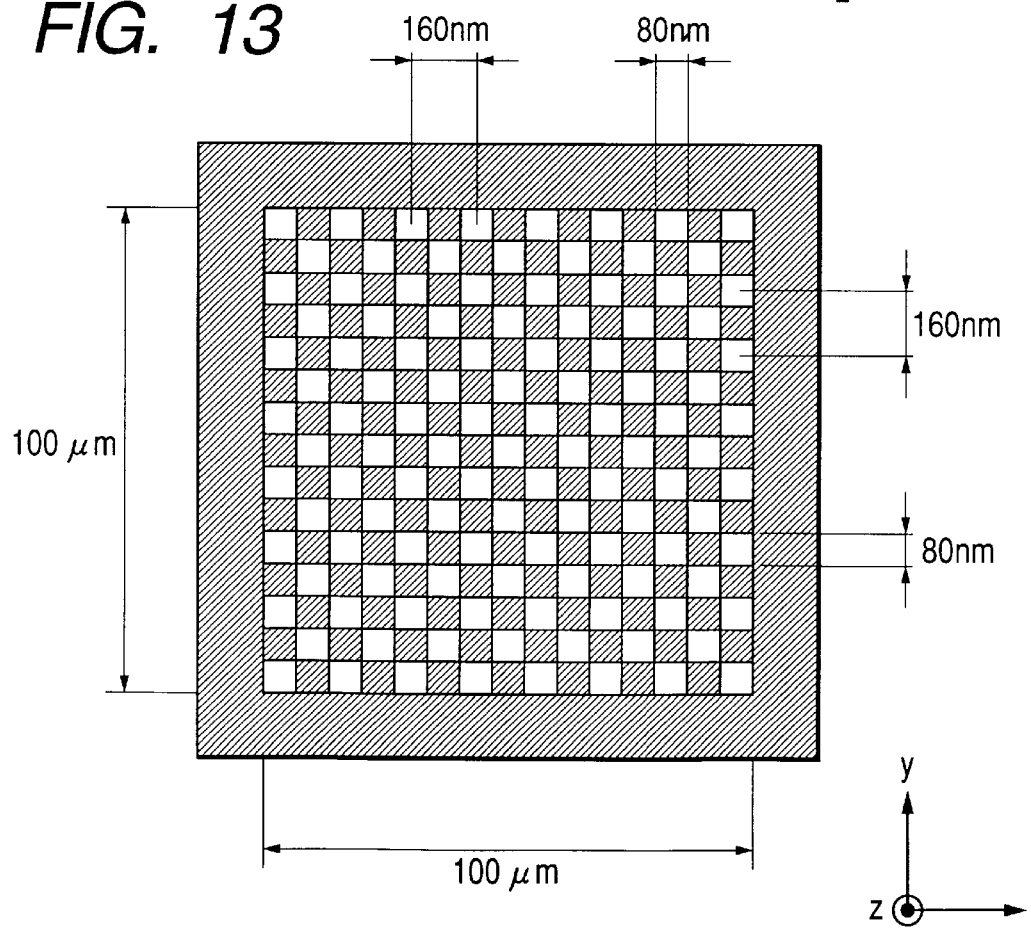
FIG. 13 illustrates an exemplary two-dimensional periodic structure aperture pattern used in EXAMPLE 5 of the present invention.

FIG. 13 illustrates another exemplary aperture pattern of a periodic structure A and a periodic structure B in EXAMPLE 5 of the present invention. In this example, the periodic minute aperture pattern comprises rectangular apertures having an aperture width of 80 nm two-dimensionally arranged at a pitch of 160 nm. The size of the region in which the apertures are provided is 100 $\mu$m×100 $\mu$m. By using such two-dimensional periodic structures, the quantity of two-dimensional relative displacement in x-y directions in FIG. 13 can be detected.

EXAMPLE 6

Figure 14:
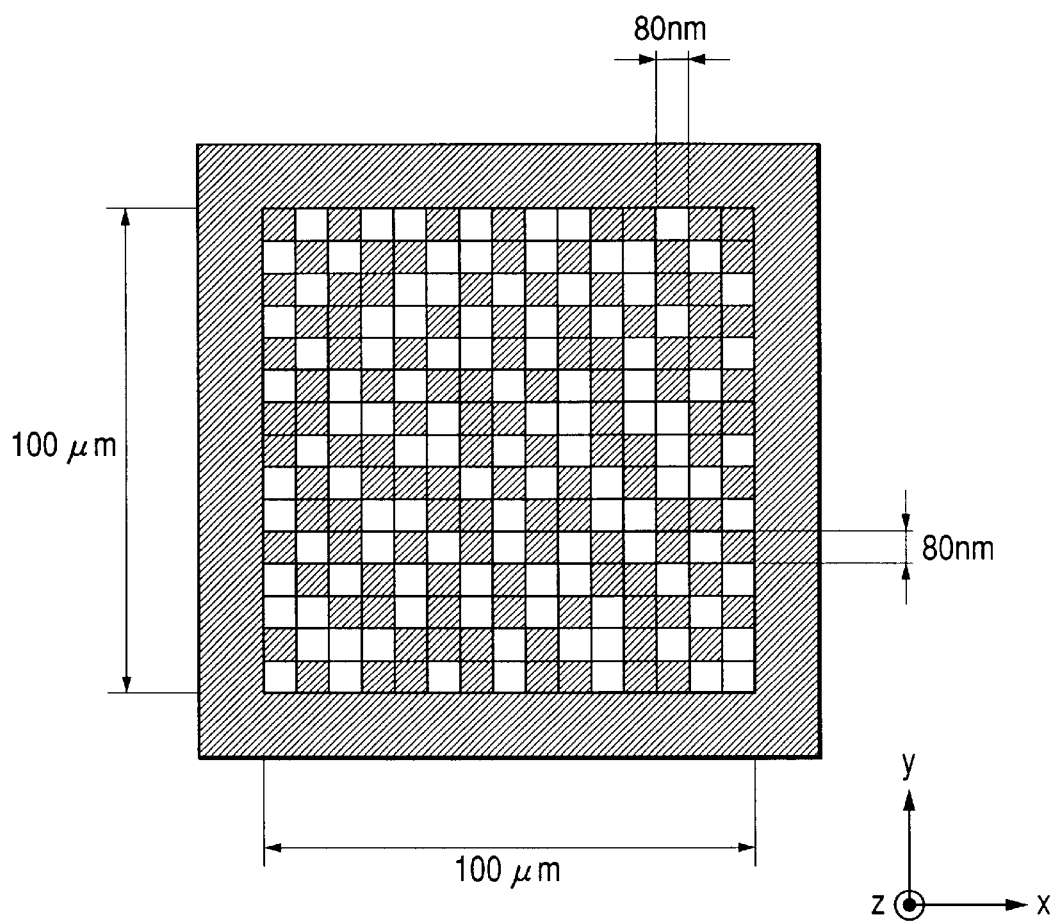
FIG. 14 illustrates an exemplary periodic structure aperture pattern of a random structure used in EXAMPLE 6 of the present invention.
Figure 15:
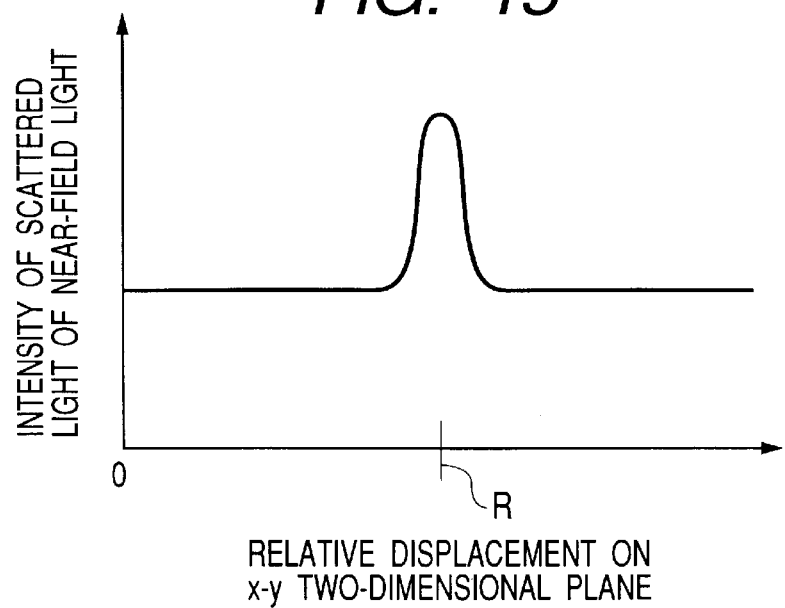
FIG. 15 illustrates changes in the intensity of scattered light of near-field light in the case where the random structure according to EXAMPLE 6 of the present invention is used in a periodic structure pattern.

FIG. 14 illustrates a further exemplary aperture pattern of a periodic structure A and a periodic structure B in EXAMPLE 6 of the present invention. In this example, the periodic minute aperture pattern comprises rectangular apertures having an aperture width of 80 nm and apertures in the combined form of a plurality of such rectangular apertures two-dimensionally arranged at random. The size of the region in which the apertures are provided is 100 $\mu$m×100 $\mu$m. However, periodic structure A and periodic structure B have a relation of reflected images to each other. When they are arranged in opposed relation to each other, positions of their aperture patterns are completely superimposed on each other at a certain position of an x-y two-dimensional plane. An area ratio of the aperture portion to the non-aperture portion is controlled to almost 1:1. When such a two-dimensional random structure is used, the intensity of the scattered light of the near-field light indicates a peak at a position R that positions of the patterns of periodic structure A and periodic structure are superimposed on each other in the x-y two-dimensional plane, as illustrated in FIG. 15. At other positions, the aperture portion of periodic structure A and the aperture portion of periodic structure B overlap each other on the average, and the intensity indicates about a half value as much as the peak value. By detecting this peak position, the absolute value in the relative displacement on the x-y two-dimensional plane, i.e., the standard position can be detected.

EXAMPLE 7

Figure 16:
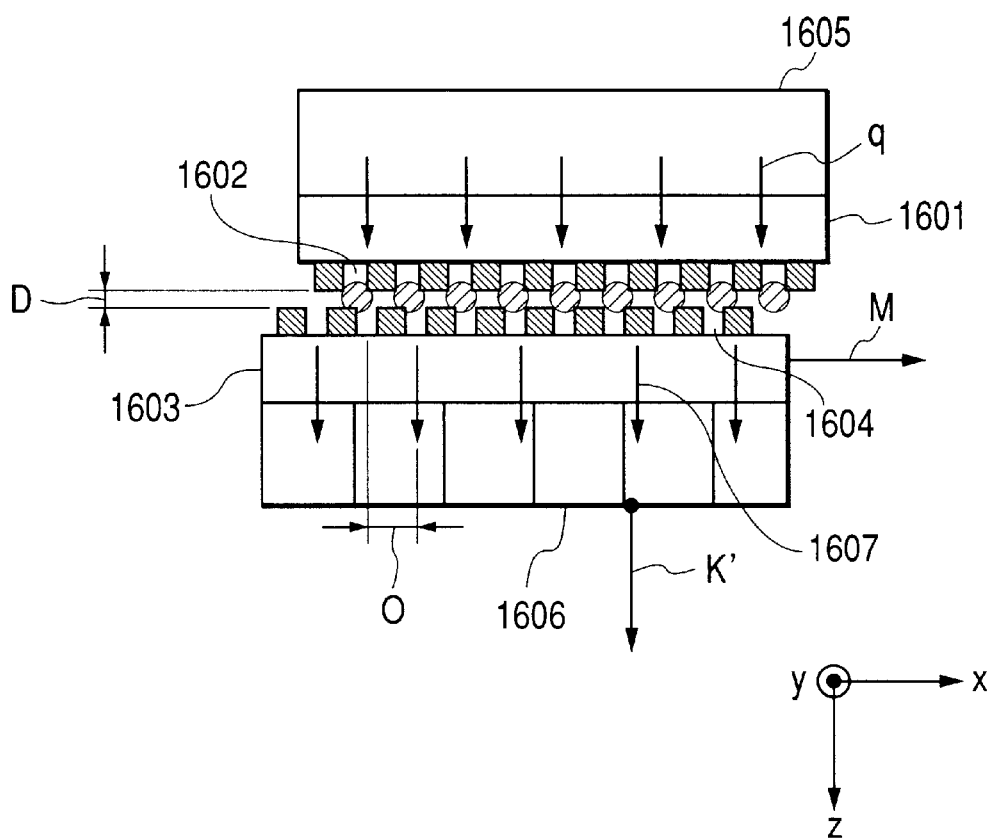
FIG. 16 illustrates an exemplary construction of a movement detecting device making use of aperture patterns of 2 periodic structures different in period in EXAMPLE 7 of the present invention.

FIG. 16 illustrates an example of a movement detecting device making use of different aperture patterns as periodic structure A and periodic structure B in EXAMPLE 7 of the present invention. In FIG. 16, a periodic minute aperture slit A 1602 provided on such a transparent support substrate A (front surface) 1601 as described above and a periodic minute aperture slit B 1604 provided on a transparent support substrate B (front surface) 1603 are arranged so as to give a space of at most 100 nm. Apertures are formed in such a manner that the period Xa of periodic minute aperture slit A 1602 and the period Xb of periodic minute aperture slit B 1604 are different from each other.

On the back surface (surface on the upper side in FIG. 16) of transparent support substrate A 1601, is installed LED (light-emitting diode) 1605 (central wavelength: about 670 nm) to apply light from the back side of periodic minute aperture slit A 1602. CCD (charge coupled device; image sensor) 1606 is installed on the back surface of transparent support substrate B 1603 to detect the two-dimensional distribution of the intensity of scattered light 1607 of near-field light scattered from on the back surface of periodic minute aperture slit B 1604.

Figure 17:
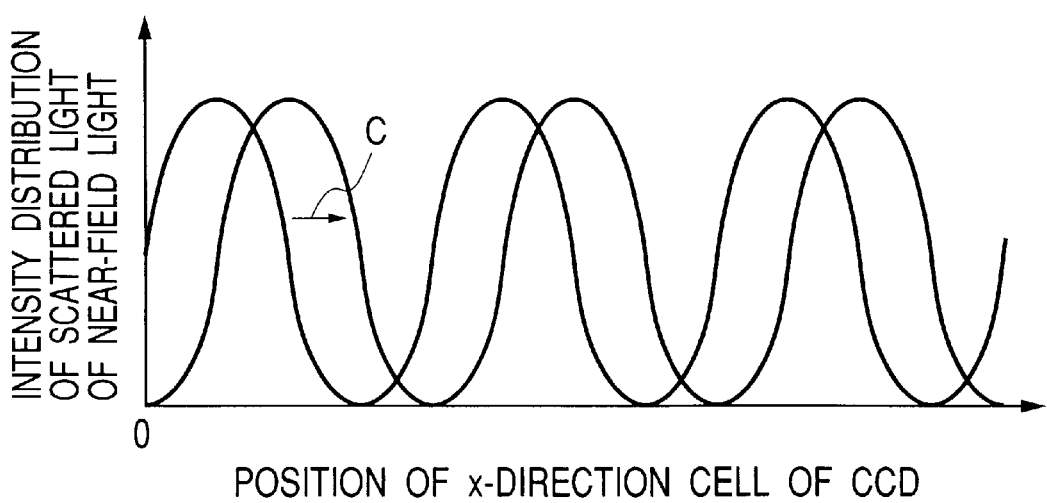
FIG. 17 illustrates the state that the intensity distribution of scattered light of near-field light in EXAMPLE 7 of the present invention shifts to a position of an x-direction cell of CCD.

When relative displacement between periodic minute aperture slit A 1602 and periodic minute aperture slit B 1604 takes place in an x direction in FIG. 16, the intensity distribution (period: XaXb/(Xa−Xb)) of scattered light 1607 of the near-field light shifts to a position of an x-direction cell of CCD as illustrated in FIG. 17, and the quantity of relative displacement periodically varies every Xb as shown by C in FIG. 17. Therefore, the quantity of relative displacement can be detected from a change in an intensity distribution signal outputted from CCD 1606. In addition, the direction of the relative displacement can be detected from the direction of the change in the intensity distribution signal. Further, in this example, the detection accuracy of the movement is irrespective of the light intensity itself, and only the intensity distribution signal may be detected. Therefore, this detecting device has an effect that no error is made by a distance variation between periodic minute aperture slit A 1602 and periodic minute aperture slit B 1604.

EXAMPLE 8

Figure 21:
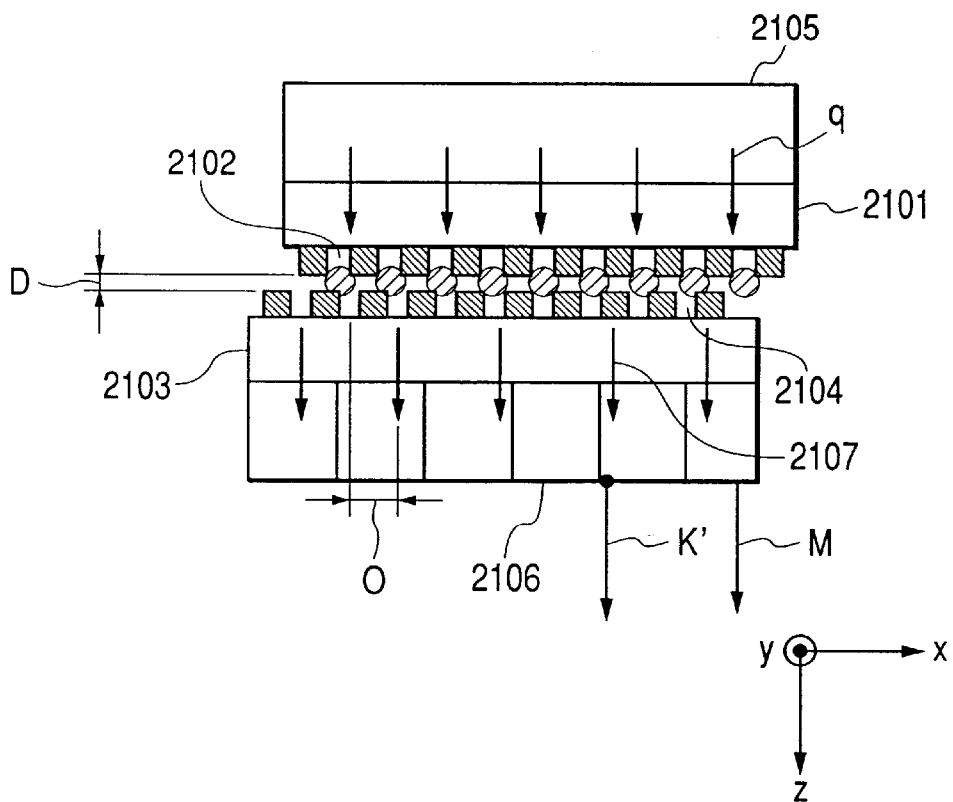
FIG. 21 illustrates an exemplary construction of a movement detecting device making use of aperture patterns of 2 periodic structures different in period in EXAMPLE 8 of the present invention.

FIG. 21 illustrates an example of a movement detecting device making use of different aperture patterns as periodic structure A and periodic structure B in EXAMPLE 8 of the present invention. In FIG. 21, a periodic minute aperture slit A 2102 provided on such a transparent support substrate A (front surface) 2101 as described above and a periodic minute aperture slit B 2104 provided on a transparent support substrate B (front surface) 2103 are arranged so as to give a space of at most 500 nm. Apertures are formed in such a manner that the period Xa of periodic minute aperture slit A 2102 and the period Xb of periodic minute aperture slit B 2104 are different from each other.

On the back surface (surface on the upper side in FIG. 21) of transparent support substrate A 2101, is installed LED (light-emitting diode) 2105 (central wavelength: about 670 nm) to apply light from the back side of periodic minute aperture slit A 2102. CCD (charge coupled device; image sensor) 2106 is installed on the back surface of transparent support substrate B 2103 to detect the two-dimensional distribution of the intensity of scattered light 2107 of near-field light scattered from on the back surface of periodic minute aperture slit B 2104.

Figure 22:
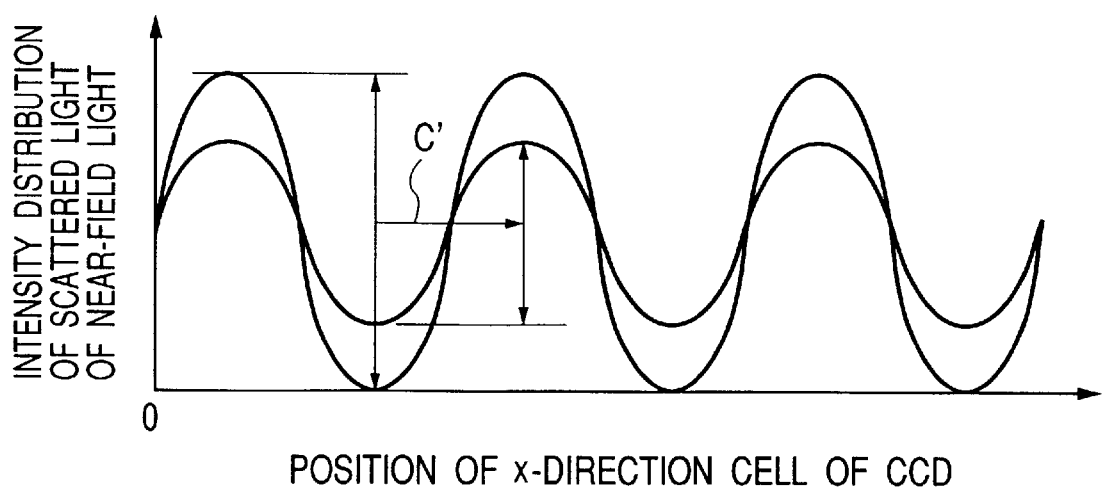
FIG. 22 illustrates the state that the amplitude of intensity distribution signals of scattered light of near-field light in EXAMPLE 8 of the present invention varies according to x-direction relative movement.
Figure 23A:
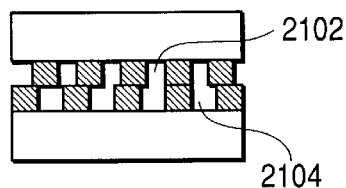
FIGS. 23A, 23B, 23C, 23D and 23E illustrate the state that the amplitude of intensity distribution signals of scattered light of near-field light in EXAMPLE 8 of the present invention varies according to the quantity of z-direction relative movement.
Figure 23B:
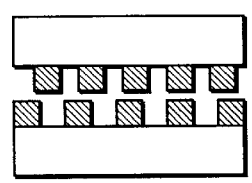
Figure 23E:
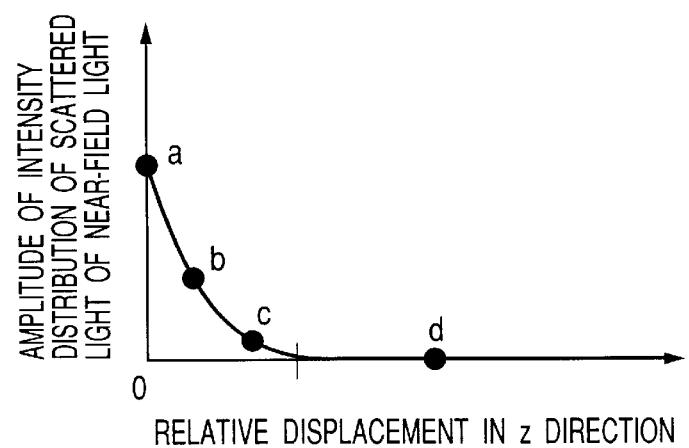
Figure 23C:
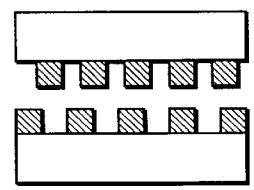
Figure 23D:
Figure 23D:
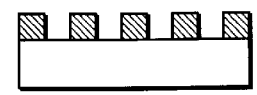

When relative displacement between periodic minute aperture slit A 2102 and periodic minute aperture slit B 2104 takes place in a z direction in FIG. 21, the amplitude of the intensity distribution (period: XaXb/(Xa−Xb)) of scattered light 2107 of the near-field light varies as illustrated by C' in FIG. 22. Therefore, the quantity of relative displacement can be detected from a change in amplitude of an intensity distribution signal outputted from CCD 2106 as illustrated in FIGS. 23A to 23E. Prots a, b, c and d represent the states shown by FIGS. 23A, 23B, 23C and 23D, respectively. Further, in this example, the detection accuracy of the movement is irrespective of the light intensity itself, and only the amplitude of the intensity distribution signal may be detected. Therefore, this detecting device has an effect that no error is made by a relative positional variation between periodic minute aperture slit A 2102 and periodic minute aperture slit B 2104 in an x direction.

EXAMPLE 9

Figure 18:
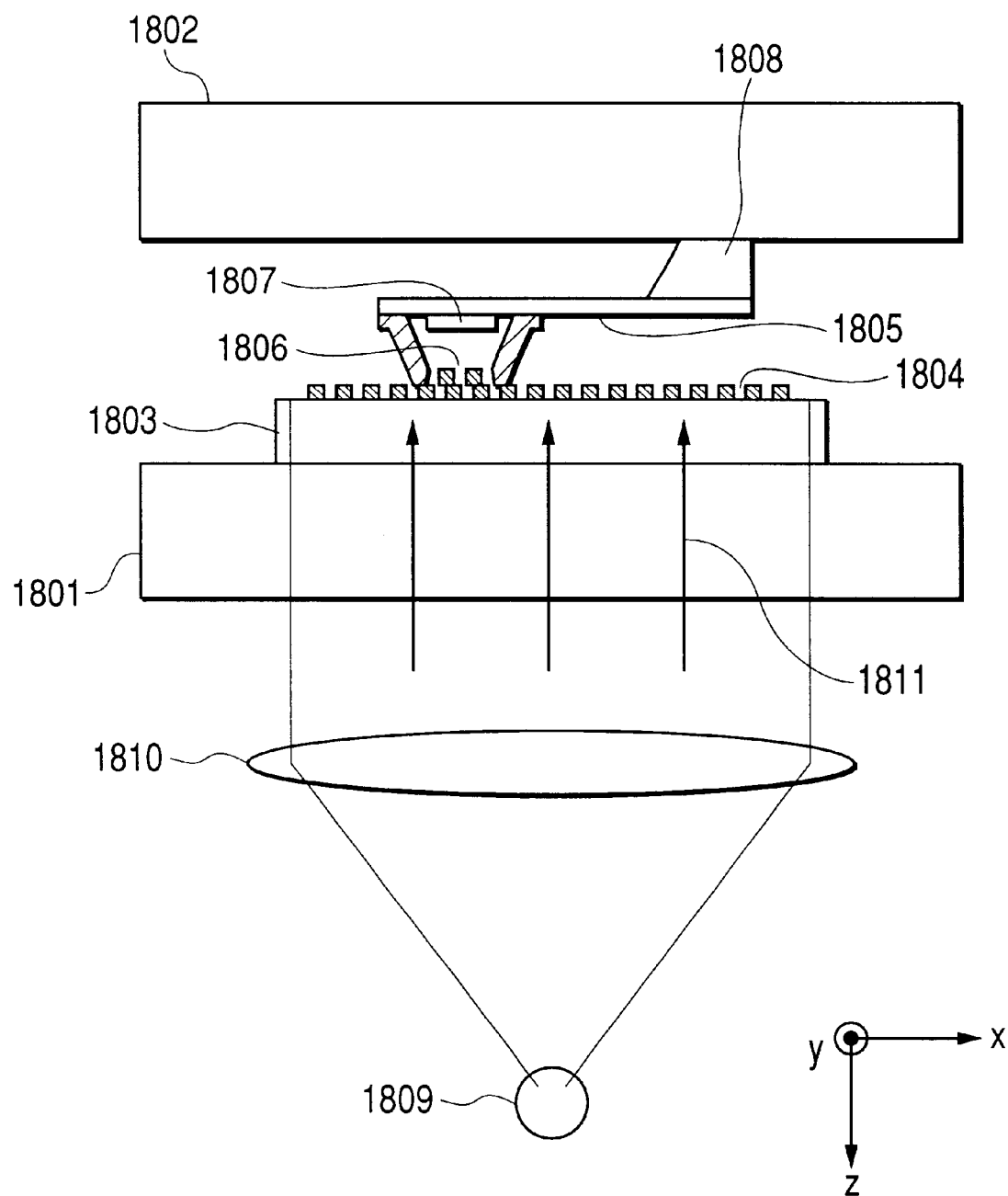
FIG. 18 illustrates an example where a movement detecting device in EXAMPLE 9 of the present invention was constructed using a micromechanics technique.

FIG. 18 illustrates an example where a movement detecting device in EXAMPLE 9 of the present invention was constructed using a micromechanics technique. In order to measure a relative displacement between a substance A 1801 and a substance B 1802, a periodic minute aperture slit A 1804 provided on a transparent support substrate A 1803 (on the upper side in FIG. 18) is installed on substance A 1801. On substance B 1802, is installed a support member 1808 on which a periodic minute aperture slit B 1806 and a microcantilever 1805 on the tip of which PD (photodiode) 1807 has been provide have been supported. In this example, the form of the cantilever is designed in such a manner that an elastic constant on z-direction deflection of the cantilever is about 0.1 N/m, thereby producing it.

The front surface (on the lower side in FIG. 18) of periodic minute aperture slit B 1806 is brought into slight contact under pressure of at most $10^{-5}$ N with the front surface (on the upper side in FIG. 18) of periodic minute aperture slit A 1804, whereby a space between both aperture slits can be controlled to at most 100 nm.

Light from a light source 1809 (coherent light having a central wavelength of about 670 nm) is collimated by a lens 1810 into incident light 1811. The principle thereof is as described above, the intensity of scattered light of near-field light scattered from on the back surface (on the upper side in FIG. 18) of periodic minute aperture slit B 1806 is detected by PD 1807, and from an intensity signal thereof, can be detected the quantity of relative displacement between periodic minute aperture slit A 1804 and periodic minute aperture slit B 1806, namely, the quantity of relative displacement between substance A and substance B.

Even when displacement in a z-direction more or less occurs (about ±100 μm) at the time displacement in an x direction takes place between substance A and substance B, the cantilever 1805 undergoes elastic deformation in the z direction to absorb this z-direction displacement, whereby the space between the front surface of periodic minute aperture slit A 1804 and the front surface of periodic minute aperture slit B 1806 can be retained in the state of at most 100 nm. Therefore, high-accuracy detection of movement becomes feasible without the influence of gap variation. At the same time, by this mechanism, the force acting between the front surface of periodic minute aperture slit A 1804 and the front surface of periodic minute aperture slit B 1806 can be substantially retained in the state of at most $1\times10^{-5}$ N. Therefore, the quantity of relative displacement can be stably detected without damaging the periodic minute aperture slits.

As described in this example, one of the 2 periodic minute aperture slits is supported on an elastic substance, and the 2 periodic minute aperture slits are brought into contact with each other in a state that the elastic substance has been deformed, whereby high-accuracy light modulation free of any influence of gap variation becomes feasible to achieve an effect that the damage of the periodic minute aperture slits is avoidable to achieve stable light modulation. This principle can be applied to not only this example, but also the switch descried in EXAMPLE 1 and a mask-wafer aligning device which will be described subsequently in EXAMPLE 10.

EXAMPLE 10

Figure 19A:
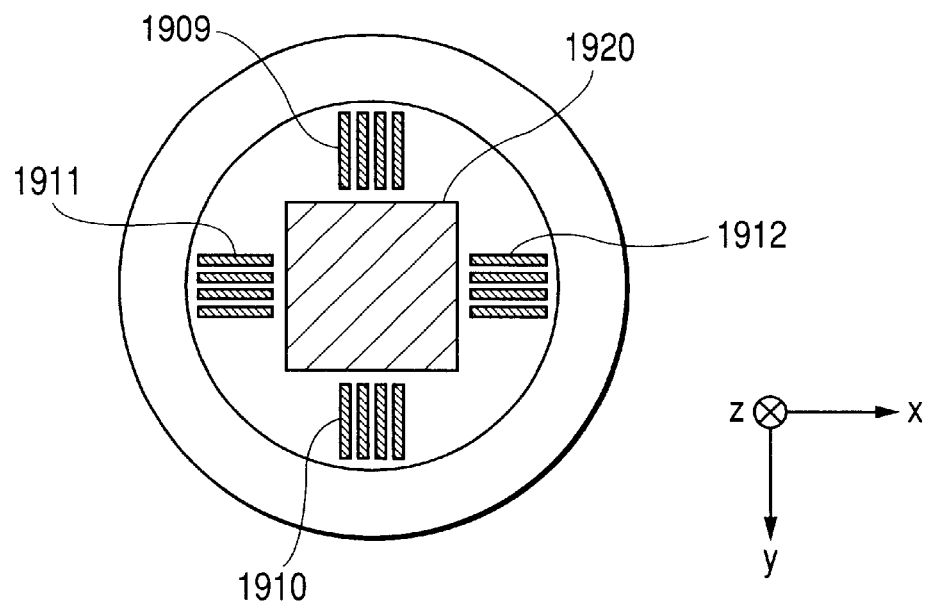
FIGS. 19A and 19B illustrate an exemplary construction of a mask-wafer aligning device to which the principle of light modulation in EXAMPLE 10 of the present invention is applied.
Figure 19B:
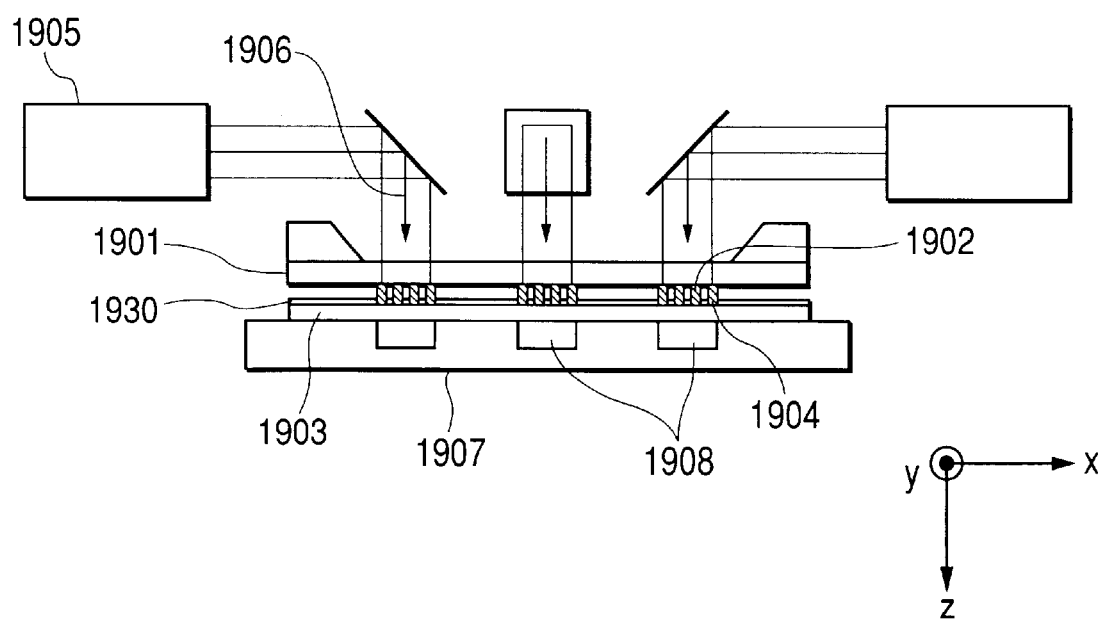
Figure 20:
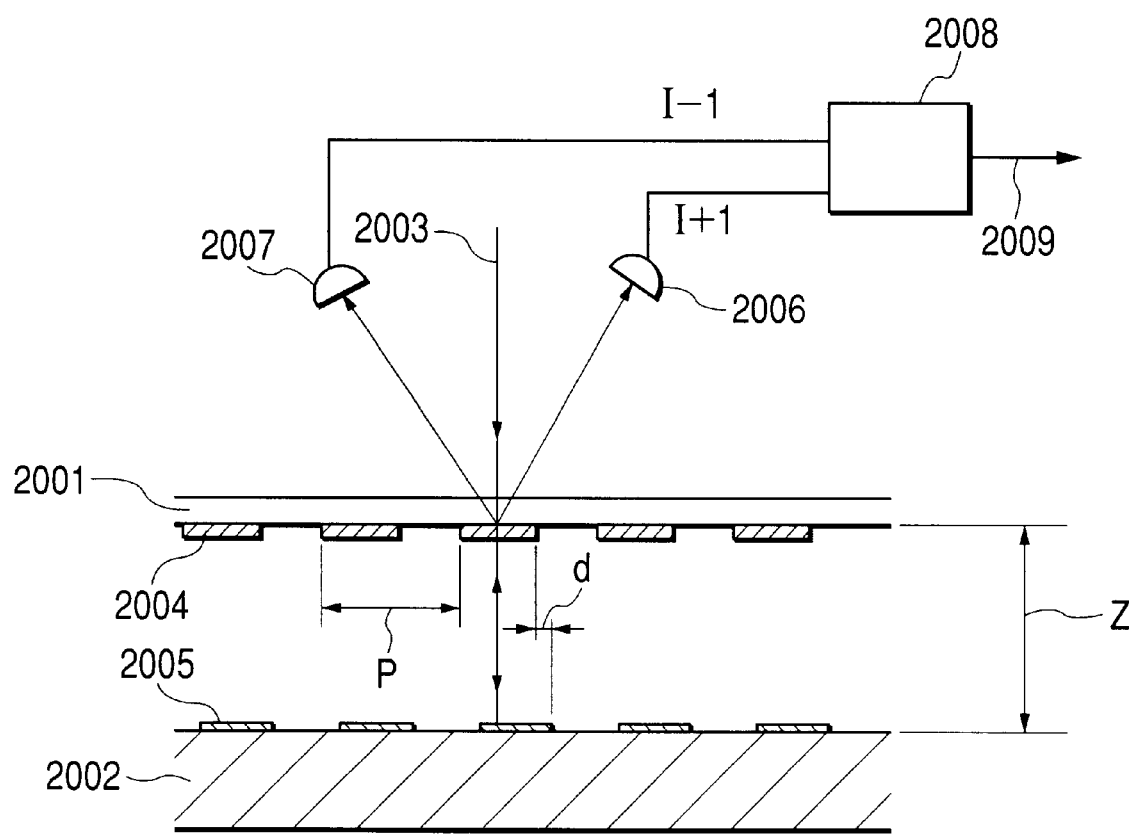
FIG. 20 illustrates a conventional example.

FIGS. 19A and 19B illustrate an exemplary construction of a mask-wafer aligning device to which the principle of light modulation in EXAMPLE 10 of the present invention is applied. FIG. 19A is a drawing viewed from above a mask, and FIG. 19B is a drawing viewed from a lateral direction perpendicular to a direction in which the mask is opposed to a wafer.

In FIGS. 19A and 19B, alignment marks A 1902 comprising a periodic minute aperture slit provided on the front surface (on the upper side in FIG. 19B) of a mask 1901 and alignment marks B 1904 comprising a periodic minute aperture slit provided on a wafer 1903 (front surface) are arranged so as to give a space of at most 100 nm. Numeral 1920 represents an exposure pattern. Numeral 1930 represents a resist.

Alignment light 1906 emitted from a light source (HeNe laser, wavelength: 633 nm) is incident on the back surfaces (on the upper side in FIG. 19B) of alignment marks 1902 through the back surface (on the upper side in FIG. 19B) of mask 1901. Light detectors 1908 are installed at positions corresponding to alignment marks B 1904 on an xyz stage 1907 on which wafer 1903 has been supported to detect the intensity of scattered light of near-field light scattered on the back sides (on the lower side in FIG. 19B) of alignment marks B 1904.

Here, as the principle thereof has been described above, when relative displacement in an x, y or z direction takes place between alignment marks A 1902 and alignment marks B 1904, the intensity of the scattered light of the near-field light varies according to the quantity of the displacement thereof as illustrated in FIGS. 3A through 3E to 7A through 7E. Therefore, the quantity of positional deviation in the x, y or z direction can be detected from signals outputted from light detectors 1908.

When x-direction alignment marks a 1909 and b 1910 are respectively arranged at positions deviated in a y direction as a pattern of the alignment mark, the quantity of rotational deviation on a z axis can be detected from a difference in the quantity of positional deviation between both marks. Further, the quantity of rotational deviation on an x axis can be detected from a difference in the quantity of z-direction positional deviation in x-direction alignment marks a 1909 and b 1910, and the quantity of rotational deviation on a y axis from a difference in the quantity of z-direction positional deviation in y-direction alignment marks a 1911 and b 1912.

The xyz stage 1907 is driven so at to compensate positional deviation detected in the above-described manner, thereby conducting 6-axis alignment between mask 1901 and wafer 1903.

Although the description has been given taking, as an example, the case where the alignment marks in the form of a one-dimensional grating in the x or y direction were used as alignment marks, the two-dimensional periodic structure described in EXAMPLE 5, the two-dimensional random pattern described in EXAMPLE 6 and the periodic structures having different periods from each other described in EXAMPLES 7 and 8 may be used as the forms of the alignment marks.

What is claimed is:

1. A light modulating apparatus comprising:

first and second periodic structures each having a period smaller than the wavelength of light emitted from a light source; and a moving means for relatively moving the two periodic structures, wherein the surface of the first periodic structure is brought near to the surface of the second periodic structure to a space not longer than the wavelength to arrange them in a state opposed to each other, the light incident on the first periodic structure is converted into near-field light by the first periodic structure, the converted near-field light is transmitted through the second periodic structure and converted into propagation light by scattering the near-field light on the back surface of the second periodic structure, and the intensity of the propagation light is modulated by relatively moving the two periodic structures by the moving means.

2. The light modulating apparatus according to claim 1, wherein the first and second periodic structures each have an aperture width and a pitch of at most a half as short as the wavelength of the light emitted from the light source.

3. The light modulating apparatus according to claim 2, wherein the first and second periodic structures each have a plural number of periods of the aperture width and the pitch in a range smaller than the wavelength of the light emitted from the light source.

4. The light modulating apparatus according to claim 1, wherein the first and second periodic structures are closely arranged with a space of at most 100 nm.

5. The light modulating apparatus according to claim 1, wherein the first and second periodic structures are formed on first and second substrates, respectively, the first periodic structure is formed on the back surface of the first substrate which is opposed to the surface of the substrate, on which the light from the light source is incident, and the second periodic structure is formed on the front surface of the second substrate which is opposed to the surface of the first periodic structure.

6. The light modulating apparatus according to claim 1, wherein the direction in which the two periodic structures are moved is a direction of a period of the two periodic structures.

7. The light modulating apparatus according claim 6, which comprises an elastic substance which supports one of the two periodic structures and can be elastically deformed in a direction of the space between which the two periodic structures are opposed to each other.

8. The light modulating apparatus according to claim 1, wherein the direction in which the two periodic structures are moved is a direction of the space between which the two periodic structures are opposed to each other.

9. An optical switch comprising the light modulating apparatus according to any one of claims 1 to 8, wherein the intensity of exit light to the incident light is switched by means of the light modulating apparatus.

10. A movement detecting device comprising:

first and second periodic structures each having a period smaller than the wavelength of light emitted from a light source;

a moving means for relatively moving the two periodic structures, wherein the surface of the first periodic structure is brought near to the surface of the second periodic structure to a space not longer than the wavelength to arrange them in a state opposed to each other, the light incident on the first periodic structure is converted into near-field light by the first periodic structure, and the converted near-field light is transmitted through the second periodic structure and scattered on the back surface of the second periodic structure, a means for detecting the intensity of the scattered light; and a means for detecting the quantity of relative movement between the first and second periodic structures.

11. The movement detecting device according to claim 10, wherein the first or second periodic structure is a two-dimensional periodic structure.

12. The movement detecting device according to claim 10, wherein the first and second periodic structures each have a random periodic structure.

13. The movement detecting device according to claim 10, wherein the first and second periodic structures are different in period from each other, and the means for detecting the intensity of the scattered light detects the intensity distribution of the scattered light.

14. A distance measuring device comprising the movement detecting device according to any one of claims 10 to 13, wherein a minute quantity of displacement is measured.

15. An alignment device between two substances, comprising:

first and second periodic structures each having a period smaller than the wavelength of light emitted from a light source;

wherein one of the periodic structures is provided on one of the two substances, and the other is provided on the other of the two substances, a moving means for relatively moving the two substances;

wherein the two periodic structures are arranged with a close space not longer than the wavelength in a state opposed to each other, a means for detecting the intensity of the transmitted light from the light source, which has been transmitted through the two periodic structures; and a means for detecting the relative positions of the first and second two periodic structures based on the intensity detected;

wherein the moving means is driven on the basis of the relative positions detected, whereby relative alignment between the two substances is conducted.

16. The alignment device according to claim 15, wherein the first or second periodic structure is a two-dimensional periodic structure.

17. The alignment device according to claim 15, wherein the first and second periodic structures each have a random periodic structure.

18. The alignment device according to claim 15, wherein the first and second periodic structures are different in period from each other, and the means for detecting the intensity of the scattered light detects the intensity distribution of the scattered light.

19. A semiconductor aligner comprising the alignment device according to any one of claims 15 to 18, wherein gap control or alignment between a mask and a wafer is conducted.

20. A light modulating process comprising the steps of:

arranging first and second periodic structures each having a period smaller than the wavelength of light emitted from a light source in a state opposed to each other in such a manner that the surface of the first periodic structure is brought near to the surface of the second periodic structure to a space not longer than the wavelength;

converting the light incident on the first periodic structure into near-field light by the first periodic structure;

causing the converted near-field light to pass through the second periodic structure to convert it into propagation light by scattering the near-field light on the back surface of the second periodic structure; and relatively moving the two periodic structures by a moving means, thereby modulating the intensity of the propagation light.

21. The process according to claim 20, wherein the first and second periodic structures each have an aperture width and a pitch of at most a half as short as the wavelength of the light emitted from the light source.

22. The process according to claim 21, wherein the first and second periodic structures each have a plural number of periods of the aperture width and the pitch in a range smaller than the wavelength of the light emitted from the light source.

23. The process according to claim 20, wherein the first and second periodic structures are closely arranged with a space of at most 100 nm.

24. The process according to claim 20, wherein the first and second periodic structures are formed on first and second substrates, respectively, the first periodic structure is formed on the back surface of the first substrate which is opposed to the surface of the substrate, on which the light from the light source is incident, and the second periodic structure is formed on the front surface of the second substrate which is opposed to the surface of the first periodic structure.

25. The process according to any one of claims 20 to 24, wherein the two periodic structures are moved in a direction of a period of the two periodic structures.

26. The process according claim 25, wherein an elastic substance which supports one of the two elastic substance which supports one of the two periodic structures and can be elastically deformed in a direction of the space between which the two periodic structures are opposed to each other is contained so as to prevent the space between the two periodic structures from being changed by bringing the two periodic structure into contact with each other in a state that the elastic substance has been elastically deformed.

27. The process according to any one of claims 20 to 24, wherein the two periodic structures are moved in a direction of the space between which the two periodic structures are opposed to each other.

28. A movement detecting process comprising the steps of:

arranging first and second periodic structures each having a period smaller than the wavelength of light emitted from a light source in a state opposed to each other in such a manner that the surface of the first periodic structure is brought near to the surface of the second periodic structure to a space not longer than the wavelength;

converting the light incident on the first periodic structure into near-field light by the first periodic structure;

causing the converted near-field light to pass through the second periodic structure to convert it into propagation light by scattering the near-field light on the back surface of the second periodic structure; and detecting the intensity of the scattered light to detect the quantity of relative movement between the two periodic structures from the intensity of the scattered light detected.

29. The process according to claim 28, wherein the first or second periodic structure is made a two-dimensional periodic structure.

30. The process according to claim 28, wherein the first and second periodic structures are each made a random periodic structure.

31. The process according to claim 28, wherein the first and second periodic structures are different in period from each other, and the means for detecting the intensity of the scattered light detects the intensity distribution of the scattered light.

32. An aligning process between two substances, comprising the steps of:

providing one of first and second periodic structures each having a period smaller than the wavelength of light emitted from a light source on one of the two substances, and providing the other on the other of the two substances;

arranging the two periodic structures with a close space not longer than the wavelength in a state opposed to each other:

detecting the intensity of the transmitted light from the light source, which has been transmitted through the two periodic structures;

detecting the relative positions of the first and second two periodic structures based on the intensity detected; and moving the relative positions of the two substances based on the relative positions detected, thereby conducting alignment between the two substances.

33. The process according claim 32, wherein the first or second periodic structure is a two-dimensional periodic structure.

34. The process according to claim 32, wherein the first and second periodic structures each have a random periodic structure.

35. The process according to claim 32, wherein the first and second periodic structures are different in period from each other, and the means for detecting the intensity of the scattered light detects the intensity distribution of the scattered light.

* * * * *